(12) United States Patent
Kolze et al.

(10) Patent No.: US 8,406,340 B2
(45) Date of Patent: Mar. 26, 2013

(54) DISTORTION AND ALIASING REDUCTION FOR DIGITAL TO ANALOG CONVERSION

(75) Inventors: Thomas J. Kolze, Phoenix, AZ (US); Bruce J. Currivan, Dove Canyon, CA (US); Ramon A. Gomez, San Juan Capistrano, CA (US)

(73) Assignee: Broadcom Corporation, Irvine, CA (US)

( * ) Notice: Subject to any disclaimer, the term of this patent is extended or adjusted under 35 U.S.C. 154(b) by 54 days.

(21) Appl. No.: 13/223,156

(22) Filed: Aug. 31, 2011

(65) Prior Publication Data
US 2012/0183110 A1    Jul. 19, 2012

Related U.S. Application Data

(60) Provisional application No. 61/433,128, filed on Jan. 14, 2011.

(51) Int. Cl.
*H04L 1/02* (2006.01)
*H04L 25/03* (2006.01)
*H04L 25/49* (2006.01)

(52) U.S. Cl. .................. 375/296; 398/193; 455/114.2

(58) Field of Classification Search .... 455/114.2–114.3; 398/192, 193; 375/296, 297
See application file for complete search history.

(56) References Cited

U.S. PATENT DOCUMENTS 6,801,086 B1 * 10/2004 Chandrasekaran ........... 330/140

* cited by examiner

*Primary Examiner* — Curtis Odom
(74) *Attorney, Agent, or Firm* — Garlick & Markison; Shayne X. Short

(57) ABSTRACT

Distortion and aliasing reduction for digital to analog conversion. Synthesis of one or more distortion terms made based on a digital signal (e.g., one or more digital codewords) is performed in accordance with digital to analog conversion. The one or more distortion terms may correspond to aliased higher-order harmonics, distortion, nonlinearities, clipping, etc. Such distortion terms may be known a priori, such as based upon particular characteristics of a given device, operational history, etc. Alternatively, such distortion terms may be determined based upon operation of a device and/or based upon an analog signal generated from the analog to conversion process. For example, frequency selective measurements made based on an analog signal generated from the digital to analog conversion may be used for determination of and/or adaptation of the one or more distortion terms. One or more DACs may be employed within various architectures operative to perform digital to analog conversion.

24 Claims, 28 Drawing Sheets

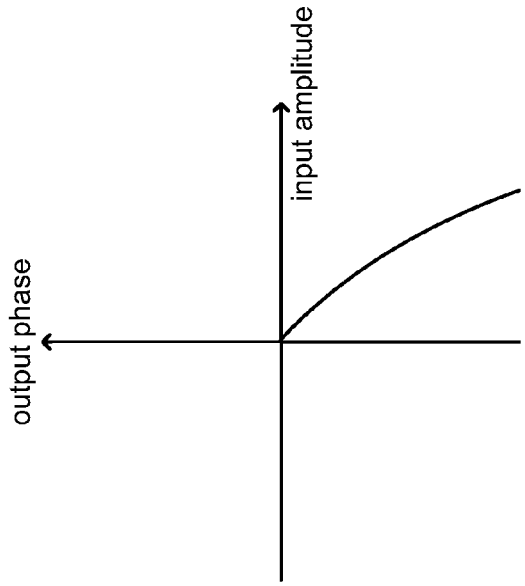
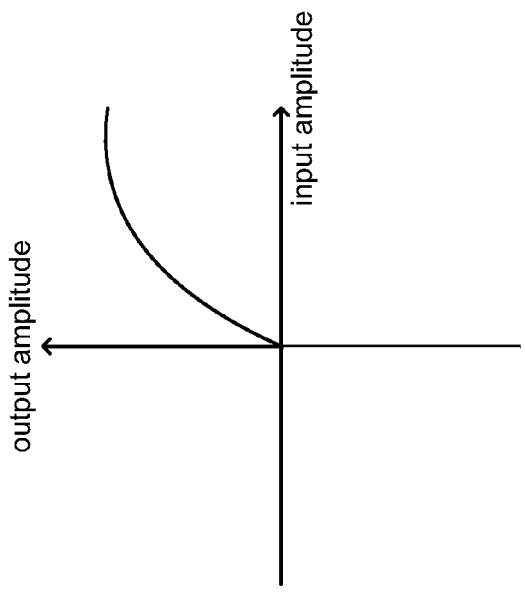
FIG. 22

DISTORTION AND ALIASING REDUCTION FOR DIGITAL TO ANALOG CONVERSION

CROSS REFERENCE TO RELATED PATENTS/PATENT APPLICATIONS

Provisional Priority Claims

The present U.S. Utility patent application claims priority pursuant to 35 U.S.C. §119(e) to the following U.S. Provisional patent application which is hereby incorporated herein by reference in its entirety and made part of the present U.S. Utility patent application for all purposes:

1. U.S. Provisional patent application Ser. No. 61/433,128, entitled "Method to extend the dynamic range of a digital-to-analog converter (DAC)," filed Jan. 14, 2011.

INCORPORATION BY REFERENCE

The following U.S. Utility patent applications are hereby incorporated herein by reference in their entirety and made part of the present U.S. Utility patent application for all purposes:

1. U.S. Utility patent application Ser. No. 13/118,429, entitled "Imbalance and distortion cancellation for composite analog to digital converter (ADC)," filed May 29, 2011, pending, which claims priority pursuant to 35 U.S.C. §120, as a continuation, to the following U.S. Utility patent application which is hereby incorporated herein by reference in its entirety and made part of the present U.S. Utility patent application for all purposes:

2. U.S. Utility patent application Ser. No. 12/949,752, entitled "Imbalance and distortion cancellation for composite analog to digital converter (ADC)," filed Nov. 18, 2010, now issued as U.S. Pat. No. 7,952,502 B2 on May 31, 2011, which claims priority pursuant to 35 U.S.C. §119(e) to the following U.S. Provisional patent application which is hereby incorporated herein by reference in its entirety and made part of the present U.S. Utility patent application for all purposes:

2.1. U.S. Provisional Application Ser. No. 61/392,604, entitled "Imbalance and distortion cancellation for composite analog to digital converter (ADC)," filed Oct. 13, 2010.

The U.S. Utility patent application Ser. No. 12/949,752 also claims priority pursuant to 35 U.S.C. §120, as a continuation-in-part (CIP), to the following U.S. Utility patent application which is hereby incorporated herein by reference in its entirety and made part of the present U.S. Utility patent application for all purposes:

3. U.S. Utility application Ser. No. 12/453,431, entitled "Analog to digital converter (ADC) with extended dynamic input range," filed May 11, 2009, now issued as U.S. Pat. No. 8,009,075 B2 on Aug. 30, 2011, which claims priority pursuant to 35 U.S.C. §119(e) to the following U.S. Provisional patent application which is hereby incorporated herein by reference in its entirety and made part of the present U.S. Utility patent application for all purposes:

3.1. U.S. Provisional Application Ser. No. 61/136,353, entitled "Analog to digital converter (ADC) with extended dynamic input range," filed Aug. 29, 2008.

4. U.S. Utility application Ser. No. 10/879,673, entitled "System and Method for adjusting multiple control loops using common criteria," filed on Jun. 29, 2004, now issued as U.S. Pat. No. 7,961,823 B2 on Jun. 14, 2011, which claims priority pursuant to 35 U.S.C. §119(e) to the following U.S. Provisional patent application which is hereby incorporated herein by reference in its entirety and made part of the present U.S. Utility patent application for all purposes:

4.1. U.S. Provisional Application Ser. No. 60/576,371, entitled "Dithering algorithm system and method," filed Jun. 2, 2004.

5. U.S. Utility application Ser. No. 10/880,959, entitled "High speed receive equalizer architecture," filed on Jun. 30, 2004, now issued as U.S. Pat. No. 7,623,600 B2 on Nov. 24, 2009, which claims priority pursuant to 35 U.S.C. §119(e) to the following U.S. Provisional patent application which is hereby incorporated herein by reference in its entirety and made part of the present U.S. Utility patent application for all purposes:

5.1. U.S. Provisional Application Ser. No. 60/576,176, entitled "High speed receive equalizer architecture," filed Jun. 2, 2004.

6. U.S. Utility application Ser. No. 12/269,865, entitled "Method and system for digital video broadcast for cable (DVB-C2)," filed on Nov. 12, 2008, pending, which claims priority pursuant to 35 U.S.C. §119(e) to the following U.S. Provisional patent application which is hereby incorporated herein by reference in its entirety and made part of the present U.S. Utility patent application for all purposes:

6.1. U.S. Provisional Application Ser. No. 60/987,371, entitled "DVB-C2," filed Nov. 12, 2007.

7. U.S. Utility application Ser. No. 13/13/223,094, entitled "Distortion and aliasing reduction for digital to analog conversion," filed concurrently on Aug. 31, 2011, pending.

8. U.S. Utility application Ser. No. 13/13/223,124, entitled "Distortion and aliasing reduction for digital to analog conversion," filed concurrently on Aug. 31, 2011, pending.

9. U.S. Utility application Ser. No. 13/13/223,182, entitled "Distortion and aliasing reduction for digital to analog conversion," filed concurrently on Aug. 31, 2011, pending.

BACKGROUND OF THE INVENTION

1. Technical Field of the Invention

The invention relates generally to communication systems; and, more particularly, it relates to imbalance and distortion cancellation for one or more digital to analog (DACs) as may be implemented within various communication devices.

2. Description of Related Art

Data communication systems have been under continual development for many years. Generally speaking, a data communication system may be viewed as supporting the transmission of any of a variety of types of information (e.g., data, voice, media, etc.) from a first location to a second location within such a communication system. Communication systems are known to support wireless and wire lined communications between wireless and/or wire lined communication devices. Also generally speaking, within the context of communication systems that employ various types of communication devices, there is a first communication device at one end of a communication channel with encoder capability and second communication device at the other end of the communication channel with decoder capability. In many instances, one or both of these two communication devices includes encoder and decoder capability (e.g., within a bi-directional communication system). Transferring information from one location to another can be applied generally within any type of communication system, including those that employ some form of data storage (e.g., hard disk drive (HDD) applications and other memory storage devices) in which data is processed and/or encoded before writing to the storage media, and then the data is processed and/or decoded after being read/retrieved from the storage media.

Certain communication systems employ one or more of various types of coding (e.g., error correction codes (ECCs) whose decoding may be performed iteratively) to ensure that the data extracted from a signal received at one location of a communication channel is the same information that was originally transmitted from another location of the communication channel. Communications systems with iterative codes are often able to achieve lower bit error rates (BER) than alternative codes for a given signal to noise ratio (SNR). ECCs, and the application of ECCs, are sometimes alternatively referred to as Forward Error Correction (FEC) codes and coding. In modern systems, the terminology "FEC" can be applied to systems incorporating FEC but including partial or full re-transmission, perhaps with feedback from the receiver to the transmitter based upon decoding success, decoding lack of success, or partial decoding results (e.g., in accordance with U.S. Utility application Ser. No. 12/269,865, entitled "Method and system for digital video broadcast for cable (DVB-C2)," which is incorporated by reference above).

In addition, any of a variety of types of communication systems may employ one or more of various types of signaling (e.g., orthogonal frequency division multiplexing (OFDM), orthogonal frequency division multiple access (OFDMA), code division multiple access (CDMA), synchronous code division multiple access (S-CDMA), time division multiple access (TDMA), etc.) to allow more than one user access to the communication system. Such signaling schemes may generally be referred to as multiple access signaling schemes.

In accordance with signals that are communicated within any of a variety of communication systems, within a transmitter communication device, digital signals typically undergo conversion to continuous time/analog signals for transmission or launching into one or more given communication channels. That is to say, one function that is oftentimes performed in accordance with transmitting a signal from one communication device to another is to perform conversion from the digital domain to the analog domain (e.g., using a digital to analog converter (DAC)). Such a continuous time/analog signal is oftentimes transmitted via a communication channel from one location to another (e.g., from one communication device to another, from one location to another location within a given communication device, etc.). Oftentimes, in accordance with performing such conversion from the digital domain to the analog domain, the conversion process may sometimes be performed less than perfectly (less than optimally) such that a digital signal may not sufficiently load the DAC.

For example, a digital codeword, when applied to a DAC for conversion to a corresponding analog signal, may underload the DAC such that an unacceptably low or insufficient power may be associated with the analog signal, or too low a signal to noise ratio (SNR) may be associated with the analog signal. And in even other situations, the conversion process may sometimes be performed less than perfectly such that a digital signal may overload a DAC. That is to say, a digital codeword, when applied to a DAC for conversion to a corresponding analog signal, may unfortunately extend beyond the linear and operable region of the DAC. In such situations, clipping and other nonlinear deleterious effects may be realized in accordance with the conversion from the digital domain to the analog domain. Even with near-optimal loading of a DAC, level errors in the DAC output (e.g., the analog output does not replicate precisely the relative numerical values attributed to the codewords input to the DAC) cause noise and harmonic and intermodulation distortion, as shown for example when one or two (or more) sinusoids are generated numerically and the DAC output is analyzed showing energy in the harmonic and intermodulation frequencies. Also contributing to the noise floor and nonlinear distortion in a DAC output are level-dependent differences in analog component values, including compression at excursions, sometimes not balanced or equal at positive and negative excursions. Phase noise or clock jitter in the DAC clocking signal also introduces distortion which can be characterized as intermodulation between the signal of interest (SOI) and the DAC clocking signal (including its phase noise or spurs).

In summary, the quantization of the numerically generated signals input to the DAC are a source of some nonlinear distortion, but level errors and nonlinear digital-word-value-to-analog-voltage-level transfer function also typically contributes additional nonlinear distortion, and level-dependent artifacts typically contribute additional significant nonlinear distortion, especially in DACs operating with high clocking frequencies. All of these nonlinear distortion mechanisms are typically contributing degradation, including nonlinear distortion characterized by generation of harmonics and intermodulation products, even without significant clipping from overloading. Overloading or underloading the DAC input typically exacerbates some or many of these nonlinear distortion mechanisms, including increasing the rate and/or amount of clipping distortion. Generally speaking, the prior art does not adequately provide for a means to address and overcome these and other deficiencies as may be experienced in accordance with digital to analog conversion within one or more DACs.

Within a communication device operative to receive a signal that has been transmitted via a communication channel, the corresponding reverse operation is performed in accordance with performing conversion from the analog to the digital domain (e.g., using an analog to digital converter (ADC)). That is to say, one function that is oftentimes performed when receiving a signal is to perform digital sampling thereof (e.g., using an ADC). When dealing with signals that may temporally vary across a relatively large dynamic range, performing such digital sampling can be problematic and incur certain deleterious effects such as undesirably low signal to noise ratios (SNRs) or undesirably large signal loading into the ADC. The prior art does not adequately provide for means to address and overcome these and other deficiencies as may be experienced in accordance with analog to digital conversion within one or more ADCs. In addition, it is noted that while the term and/or terminology of "codeword" is utilized in both error correction code (ECC) and digital to analog converter (DAC) related descriptions, the term and/or terminology of "codeword" has a different respective meaning for each respective application context (e.g., ECC vs. DAC related descriptions).

BRIEF DESCRIPTION OF THE SEVERAL
VIEWS OF THE DRAWINGS

FIG. 22 illustrates an embodiment of amplitude modulation-amplitude modulation (AM-AM) characteristics and AM-phase modulation (AM-PM) characteristics.

Figure 1:
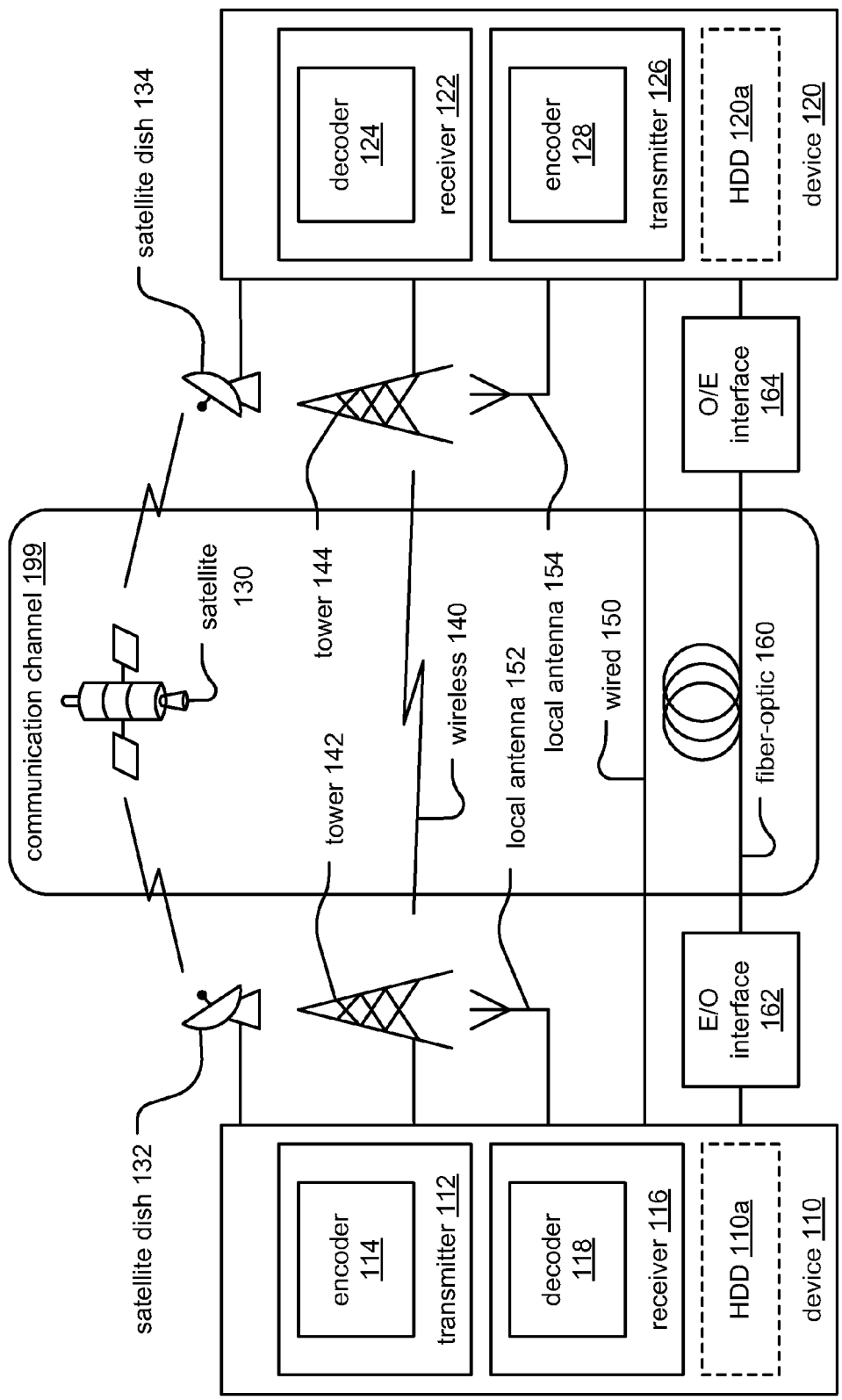
FIG. 1 and FIG. 2 illustrate various embodiments of communication systems.

FIG. 26A, FIG. 26B, FIG. 27, FIG. 28A, and FIG. 28B are diagrams illustrating embodiments of methods for operating one or more devices including at least one digital to analog converter (DAC) therein.

DETAILED DESCRIPTION OF THE INVENTION

Improvement in the performance of digital to analog signal conversion is presented herein. Reduction of various deleterious effects as may be experienced at both the upper and lower loading and reduction of limitations associated with digital to analog conversion, may be achieved in accordance with performing digital to analog conversion in accordance with various embodiments, aspects, and their equivalents, as presented herein.

As the reader will understand, conversion from the digital to the analog domain, such as may be performed within any of a variety of devices, may unfortunately be performed less than perfectly (due to practical restraints and limitations) and may suffer from a number of effects including spurious emissions. Generally speaking, one or more digital codewords are provided to one or more digital to analog converter (DACs) for generating one or more analog signals. It is noted here that such terminology as continuous time signal, analog signal, etc. such as a signal that is output from a DAC, such as in accordance with the digital to analog conversion of a digital signal, may be used interchangeably. For brevity in accordance with various illustrations provided herein, analog signal is oftentimes used.

Typically, a digital signal is provided to a DAC in the form of a sequence of digital values, such as a digital bitstream, a sequence of digital codewords, a sequence of digital labels, etc. The individual respective values within the digital signal are successively and respectively applied to a DAC in accordance with generating an analog signal. A DAC is operative to seam the successive digital values within the digital signal together thereby forming the analog signal.

When a digital codeword is provided to a digital to analog converter (DAC) for conversion from the digital domain to the analog domain, the conversion process may be performed less than perfectly due to the inherent limitations of a DAC. Ideally, the conversion process would be performed linearly and perfectly for any given digital codeword. However, a typical DAC is operative to provide its best performance and its most linear performance within a certain range. When a digital codeword provided to a DAC is relatively large or reaching the upper end of the linear operating range of the DAC, the DAC may exhibit nonlinear characteristics including clipping in accordance with generating an analog signal. When a digital codeword exceeding the linear operational range of the DAC is applied thereto, the corresponding DAC will exhibit nonlinear characteristics including clipping in accordance with generating an analog signal. At this top end of the dynamic range of a given DAC, distortion may unfortunately be generated including third order harmonics and intermodulation products (e.g., and sometimes, $2^{nd}$ harmonics and inter-modulation products and even higher order harmonics and intermodulation products). When the digital codeword provided to a DAC is relatively small or reaching the lower end of the operational range of the DAC, operation of the DAC may be quantization noise limited. At the lower end of the operational range, nonlinear distortion also may be manifested due to the relatively coarse quantization step size associated with the digital codewords when only a few of the least significant bits are varying for a duration of time (or number of successive codewords).

In accordance with appropriate operation of signal conversion from the digital domain to the analog domain, the operation of the DAC preferably would not be underloaded (e.g., being quantization noise limited, not providing an adequate output power, etc.) or overloaded (e.g., clipping, nonlinearity, distortion, aliasing, higher order harmonics, etc.). However, in real life applications, operation at or near the limitations of various devices, including near saturation of a DAC in which such a DAC exhibits nonlinear characteristics, is oftentimes unavoidable.

A number of different architectures are presented herein that they be applied for use in improving digital to analog conversion. Such conversion from the digital domain to the analog domain may be performed within any of a variety of contexts including communication systems, storage devices, etc. Sometimes, a given device includes functionality and/or circuitry therein for performing both conversion from the digital domain to the analog domain as well as conversion from the analog domain to the digital domain. For example, within a communication device such as a transceiver, generation of signals for transmission into one or more communication channels may be associated with digital to analog conversion, and processing of signals received from one or more communication channels may be associated with analog to digital conversion.

Aliased harmonic reduction, improved linearity, distortion cancellation, reduced skirt spectral skirts, and reduced spurious emissions in accordance with the various principles and aspects presented herein, may be performed for use by one or more digital to analog converters (DACs) within any of a variety of communication systems and/or applications. Such processing techniques, architectures, and/or approaches presented herein can be employed within a wide variety of communication systems, some types of which are described below.

Generally speaking, the goal of digital communications systems is to transmit digital data from one location, or subsystem, to another either error free or with an acceptably low error rate. In accordance with such digital communication systems, digital information is oftentimes transmitted from one communication device to at least one other. Within a transmitting communication device, digital information typically undergoes various processing to generate an analog signal suitable for launching into a communication channel. At the other end of the communication channel, a receiving communication device processes the received analog signal, which may have undergone some degradation or reduction in signal fidelity, in accordance with making estimates of the original digital information that underwent processing within the transmitting communication device. One of the processes performed with respect to the received analog signal is analog to digital conversion.

As shown in FIG. 1, data may be transmitted over a variety of communications channels in a wide variety of communication systems: magnetic media, wired, wireless, fiber, copper, and other types of media as well.

Figure 2:
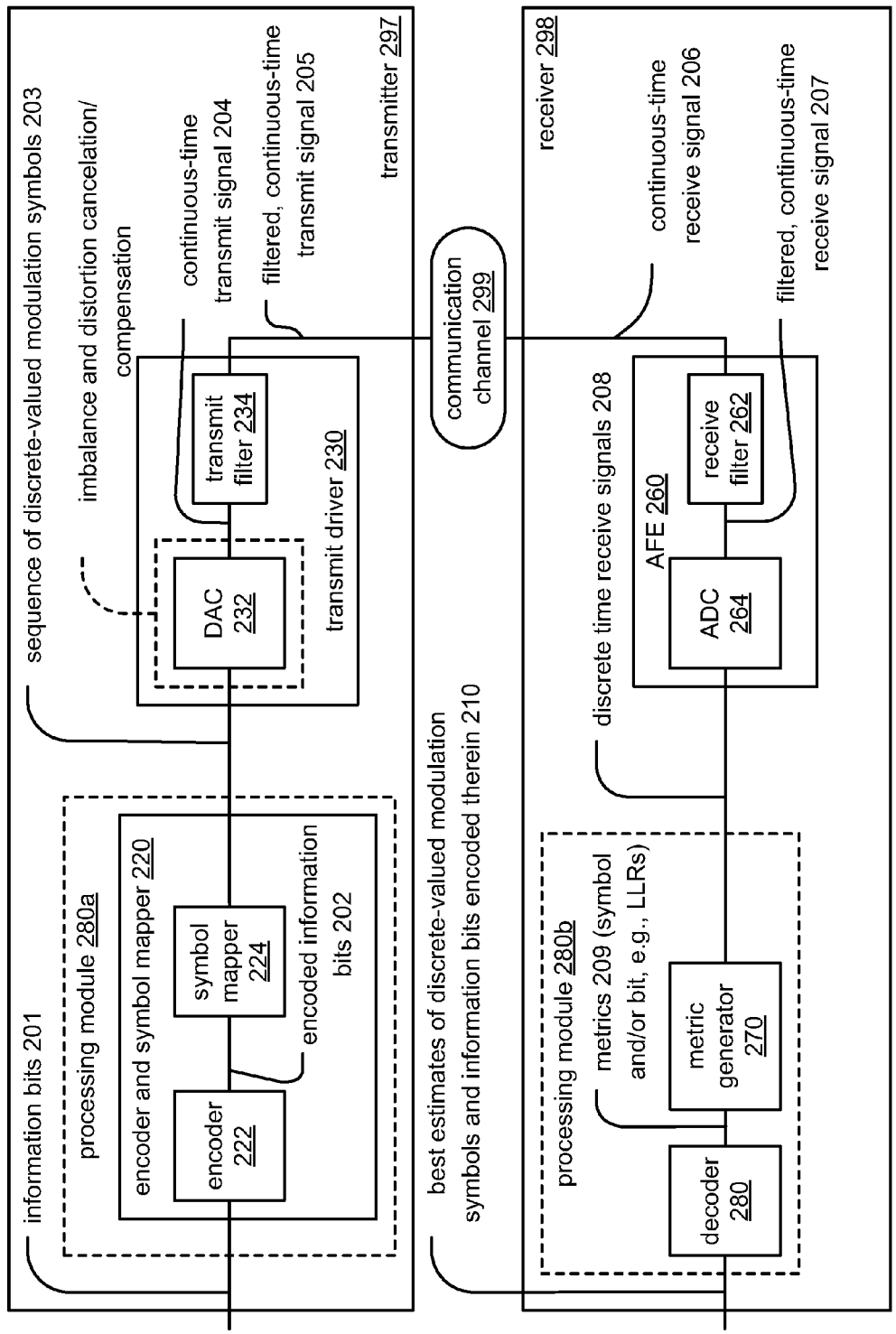

FIG. 1 and FIG. 2 are diagrams illustrate various embodiments of communication systems, respectively.

Referring to FIG. 1, this embodiment of a communication system is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

Either one or both of the communication device 110 and the communication device 120 can include a hard disk drive (HDD) (or be coupled to a HDD). For example, the communication device 110 can include a HDD 110a, and the communication device 120 can include a HDD 120a.

In some instances, to reduce transmission errors that may undesirably be incurred within a communication system, error correction and channel coding schemes are often employed. Generally, these error correction and channel coding schemes involve the use of an encoder at the transmitter and a decoder at the receiver. Clearly, a given communication device may include both an encoder and a decoder to effectuate bi-directional communication with one or more other communication devices; in other embodiments, a given communication device includes only encoding functionality (e.g., a transmitter type communication device) or only decoding functionality (e.g., a receiver type communication device).

Any of the various types of imbalance and distortion cancellation described herein, and their equivalents, can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit (TX) filter 234 to generate a filtered, continuous-time transmit signal 205 that substantially comports with the communication channel 299.

At a receiving end of the communication channel 299, continuous-time receive signal 206 is provided to an AFE (Analog Front End) 260 that includes an automatic gain control (AGC) circuit or module 261, a receive (RX) filter 262 (that generates a filtered, continuous-time receive signal 207) and one or more ADCs (Analog to Digital Converters) 264 (that generates discrete-time receive signals 208). The ADC(s) 264 may be viewed as incorporating imbalance and distortion cancellation/compensation functionality in accordance with the principles and/or aspects of the invention presented herein; such functionality may be directed to embodiments including two or more ADCs. Greater details are provided herein regarding various means by which such imbalance and distortion cancellation may be effectuated. A metric generator 270 calculates metrics 209 (e.g., on either a symbol and/or bit basis) that are employed by a decoder 280 to make best estimates of the discrete-valued modulation symbols and information bits encoded therein 210. The decoder 280 may be a forward error correction (FEC) decoder employing any of a variety of error correction codes (ECCs).

Within each of the transmitter 297 and the receiver 298, any desired integration of various components, blocks, functional blocks, circuitries, etc. therein may be implemented. For example, this diagram shows a processing module 280a as including the encoder and symbol mapper 220 and all associated, corresponding components therein, and a processing module 280 is shown as including the metric generator 270 and the decoder 280 and all associated, corresponding components therein. Such processing modules 280a and 280b may be respective integrated circuits. Of course, other boundaries and groupings may alternatively be performed without departing from the scope and spirit of the invention. For example, all components within the transmitter 297 may be included within a first processing module or integrated circuit, and all components within the receiver 298 may be included within a second processing module or integrated circuit. Alternatively, any other combination of components within each of the transmitter 297 and the receiver 298 may be made in other embodiments.

As the reader will understand, various aspects and principles of the invention are operative to ensure proper performance in accordance with conversion of one or more signals from the digital domain to the analog domain. For example, such deleterious effects as clipping, aliasing, higher-order harmonics, etc. may be mitigated within one or more DACs employed to perform conversion of one or more signals from the digital domain to the analog domain.

The processing of signals within either of the previous embodiments may be implemented to include various aspects and/or embodiments of the invention therein (e.g., any such embodiment that includes conversion of one or more signals from the digital domain to the analog domain, such as by one or more DACs, etc.). In addition, several of the following Figures describe other and particular embodiments (some in more detail) that may be used to support the devices, systems, functionality and/or methods that may be implemented in accordance with certain aspects and/or embodiments of the invention.

Figure 3:
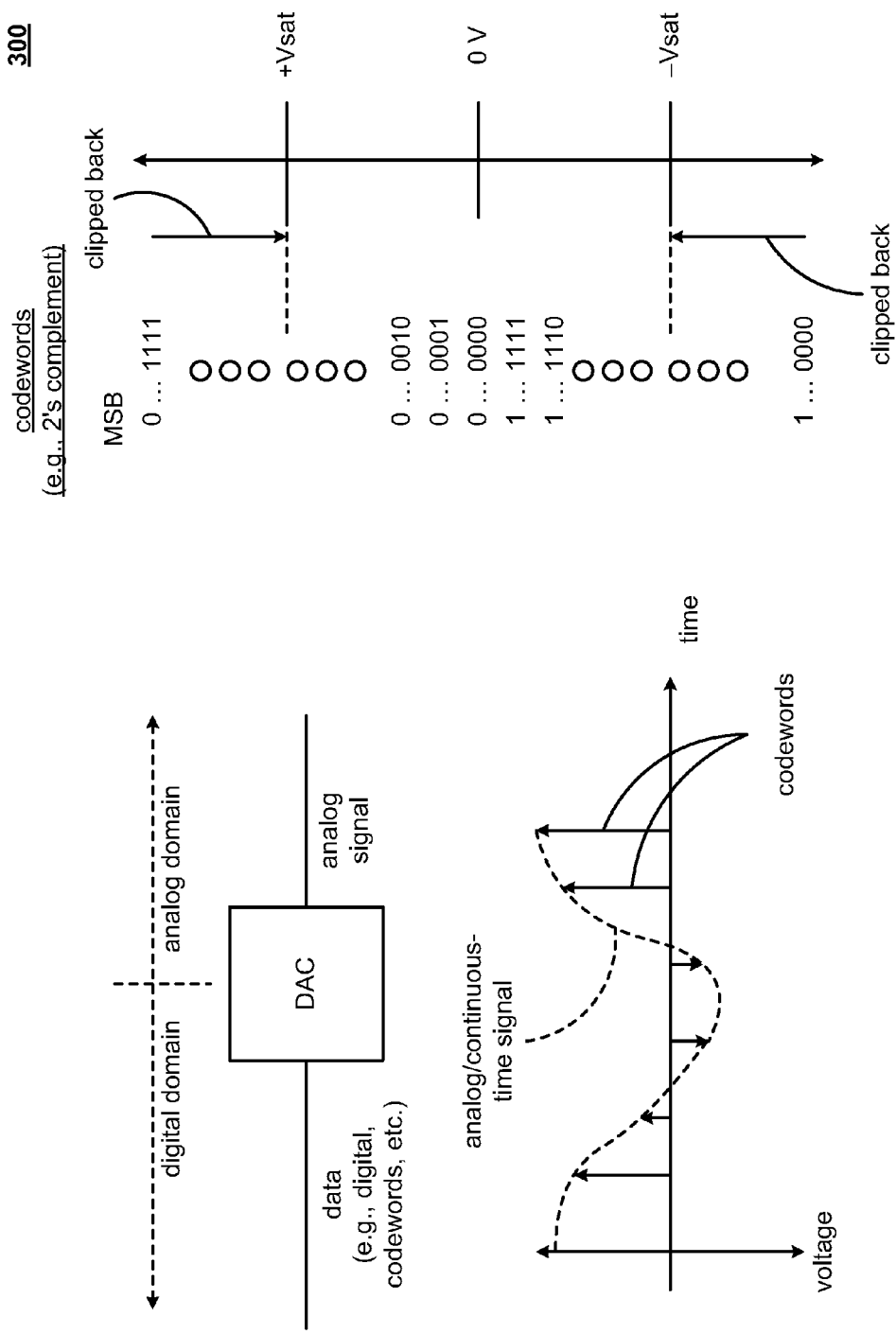
FIG. 3 illustrates an embodiment of digital to analog conversion.

FIG. 3 illustrates an embodiment 300 of digital to analog conversion. In accordance with conversion of signals from the digital domain to the analog domain, such conversion processing may be effectuated using a digital to analog converter (DAC). Data (e.g., digital, codewords, etc.) is provided to a DAC from which an analog signal is output. Oftentimes, the digital signal is composed of symbol labels, codewords, etc. that respectively are mapped to a corresponding voltage. For example, depending upon the particular value of a codeword that is provided to a DAC, a corresponding voltage is output from that DAC.

Referring to the lower left-hand side of the diagram, it can be seen that as different respective codewords are provided to a DAC, corresponding output voltages are provided from that DAC. Oftentimes, such a DAC performs the appropriate processing to ensure that the analog signal is in fact a continuous time signal. Again, as mentioned elsewhere herein, such terminology as analog signal, continuous time signal, etc. may be used interchangeably.

A DAC will oftentimes have a particular linear operating range. Referring to the right-hand side of the diagram, it can be seen that the linear operating range of a DAC may be viewed as extending between a positive saturation voltage and a negative saturation voltage. When a codeword is provided to the DAC that corresponds to a voltage that is beyond this linear operating range, the actual output voltage from the DAC will be clipped back to the respective positive saturation voltage or the negative saturation voltage.

It is noted that such operation, such as saturation or overloading of the DAC, can result in a number of deleterious effects including nonlinear distortion, clipping, aliasing, generation of intermodulation products, higher-order harmonics being aliased downward in frequency, etc.

Herein, a variety of different approaches are presented to deal with, minimize, reduce, or eliminate such deleterious effects. In various embodiments, distortion synthesis is performed for use in improving digital to analog conversion. In some instances, the distortion synthesis is particularly targeted in dealing with relatively low frequency and/or narrow bandwidth spurious emissions that may be generated in accordance with imperfect digital to analog conversion. Sometimes, a second DAC is particularly employed to deal with such relatively low-frequency and/or narrow bandwidth spurious emissions.

In even other instances, the distortion synthesis is particularly targeted in dealing with improving transition band and/or stopband performance. Generally speaking, such distortion synthesis is directed towards reducing energy above a Nyquist folding frequency. By providing better stopband attenuation, much more efficient network operation may be achieved. Oftentimes, a second DAC is employed to reduce the energy in the transition band and/or at and beyond the onset of the stopband.

In yet other instances, the distortion synthesis is particularly targeted in dealing with devices that perform digital to analog conversion such that the folding frequency is relatively much wider than the transmitter bandwidth in a given operational mode. In certain such embodiments, the distortion synthesis may be understood as applying an AM-AM and AM-PM characteristic corresponding to an estimate of the characteristic memory-less nonlinearity that the signal path is subjected to. Other nonlinear synthesis models apply in other certain applications. In some applications, different nonlinear distortion terms (e.g., $x^2$, $x^3$, etc.) are synthesized. From certain perspectives and in certain situations, distortion synthesis may be viewed as being substantially different than pre-distortion. Such characteristics may be adapted based upon feedback corresponding to various respective power measurements as well as by adapting coefficients operating upon the synthesized and filtered distortion terms. Within various embodiments and/or diagrams herein, such power measurements may be effectuated using an integrated or implemented one or more power measurement functional blocks, circuitries, and/or modules, etc. Alternatively, such power measurements may be effectuated using an externally located power measurement functional blocks, circuitries, and/or modules, etc. (e.g., a commercially available spectrum analyzer having access to such nodes, points, etc. within a device via one or more input and/or output ports). A designer is provided a wide variety of options by which such power measurements may be effectuated in accordance with various aspects, embodiments, and/or their equivalents of the invention.

It is noted that such improvements as may be effectuated for digital to analog conversion of signals may be implemented within any of a variety of devices. The context of communication systems, a communication device will oftentimes include at least one DAC. Digital signals are converted into analog signals in accordance with generating a signal that is compliant with a communication channel with which such a communication device may interact. Such types of communication devices include transceivers, transmitters, etc. and generally any type of communication device that will perform digital to analog conversion of signals therein. In addition, other types of devices may also include in accordance with various aspects, and their equivalents, of the various means, functionalities, architectures, etc. as presented herein for effectuating digital to analog conversion of signals. That is to say, certain types of devices that are not necessarily communication devices may nonetheless performed digital to analog conversion in accordance with their respective operation. Any such device implemented to perform digital to analog conversion can employ such functionality as described herein.

Within many of the various embodiments and/or diagrams presented herein, it is noted that certain additional components, functional blocks, circuitries, etc. may also be included without departing from the scope and spirit of the invention. For example, certain embodiments and/or diagrams illustrate respective subsets of different components, functional blocks, circuitries, etc. that can operate in conjunction and cooperatively with one another. Moreover, it is noted that alternative embodiments may be viewed as being respective subsets of the components, functional blocks, circuitries, etc. included within a pictorially illustrated embodiment and/or diagram (e.g., in accordance with various aspects, and their equivalents, of the invention may be found within a subset of the components, functional blocks, circuitries, etc. included within a given diagram).

Figure 4:
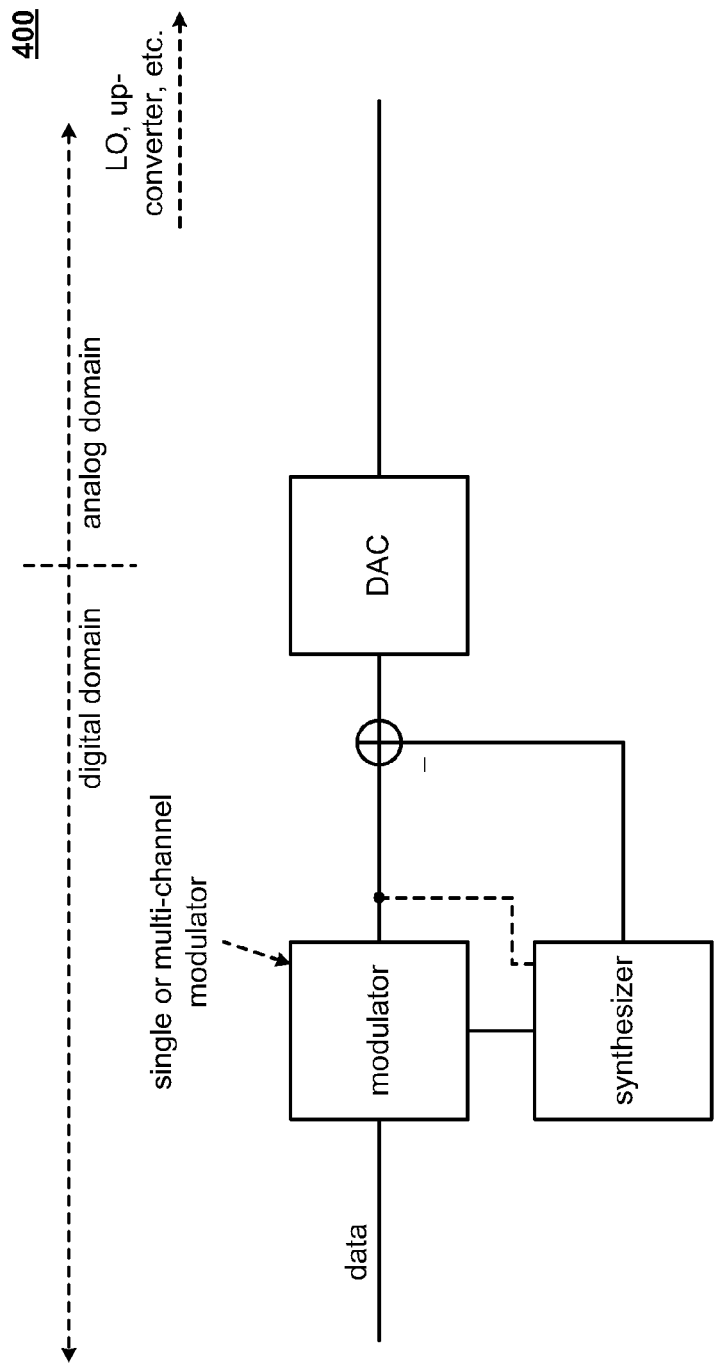
FIG. 4 illustrates an embodiment of distortion synthesis for improving digital to analog conversion.

FIG. 4 illustrates an embodiment 400 of distortion synthesis for improving digital to analog conversion. As can be seen with respect to this diagram, data is provided to a modulator. Such a modulator may be a single channel modulator or a multichannel modulator. That is to say, such a modulator may be implemented to generate a composite signal corresponding to multiple channels such as in accordance with a multichannel modulator, or alternatively, such a modulator may be implemented to generate a given signal corresponding to a singular channel. In some embodiments, the modulator contains an adaptable buffer, which in some applications is used to compensate for delays inherent in narrowband filtering in the synthesized signal path.

For example, within certain application contexts, a modulator may be implemented for generating a large number of downstream quadrature amplitude modulation (QAM) channels on a singular radio frequency (RF) port. In one particular application, such as in accordance with communications compliant with the Data Over Cable Service Interface Specification (DOCSIS), for particularly in the case of communications compliant in accordance with the DOCSIS Radio Frequency Interface (DRFI) specification, a modulator may be implemented for generating a large number of downstream QAM channels on a single RF port, and the specification also places stringent emissions requirements for the generated signal. In some embodiments, such a modulator may be viewed as being a "dense modulator", in that, a number of downstream channels must be able to be provided from a singular modulator. It is also noted that such a dense modulator must be capable of generating as few as one or a relatively small number of QAM channels. The DRFI spurious emissions requirements for such applications are beyond what the current state-of-the-art can provide, namely, with respect to the combination of a dense modulator and digital to analog converter (DAC). Generally speaking, many DACs that provide for an acceptable level of complexity do not meet the aliased second (2nd) harmonic performance requirements necessary for emissions compliance, and as such, are not amenable for application in accordance with DRFI modulator applications. Upstream modulators and transmitters within cable modems (CMs) are also subject to spurious emissions requirements, among other fidelity requirements, in the DOCSIS 3.0 PHY specification, and meeting these requirements is always balanced with the challenge of meeting high transmission power and reducing complexity of the transmitter, including oftentimes a DAC implemented therein.

Referring again to the diagram, from the modulator, different respective codewords are provided to a synthesizer for generating one or more distortion terms. In alternative embodiments, instead of providing codewords directly from the modulator to the synthesizer, the signal output from the modulator is provided to the synthesizer for use by the synthesizer in generating the one or more distortion terms. In even other particular embodiments, some combination of codewords and the signal output from the modulator are employed by the synthesizer for use in generating the one or more distortion terms. Alternatively, distortion terms may be sufficiently characterized and understood that an algorithmic computation may be available and sufficient to compute (determine) the distortion terms from a current (or soon to be employed) operational mode (e.g., number of active transmitting channels and their center frequencies, symbol rates, power levels, etc.).

The one or more distortion terms may be predetermined. For example, depending upon a priori knowledge, experience, operational history, etc. of a given device, such distortion terms may be determined. For example, such distortion terms may be calculated beforehand and off-line and stored in a memory (e.g., a lookup table). That is to say, certain implementations may be sufficiently characterized and sufficiently known that the distortion terms may be predetermined.

In other embodiments, such distortion terms are determined in real-time. For example, as may also be seen with respect to other embodiments, certain frequency selective measurements may be made and the results there from may be used to select one or more distortion terms.

The one or more distortion terms are then combined with the signal output from the modulator thereby generating a modified signal that is provided to the DAC. It is of course noted that, depending upon the particular implementation, the one or more distortion terms output from the synthesizer may be negative in value such that they actually are added to the signal output from the modulator. In other particular implementations, the one or more distortion terms output from the synthesizer may be positive value such that they are actually subtracted from the signal output from the modulator. The reader will understand that different and various implementations may be made for effectuating the removal of such distortion from the signal output from the modulator. Pictorially, many of the embodiments depicted herein indicated that one or more distortion terms are subtracted from the signal output from the modulator. Again, however, it is noted that depending upon the sign convention employed for the one or more distortion terms, those distortion terms may be added to or subtracted from the signal output from the modulator for effectuating the removal of distortion from that signal output from the modulator.

The modified signal, having reduced and/or eliminated distortion, is then provided to the DAC from which an analog signal is output. By effectively eliminating distortion from the signal output from the modulator before it is provided to the DAC, spurious emissions from a device performing such digital analog conversion may be significantly reduced. In other applications, the modified signal prior to the DAC contains the inverse of distortion terms which have yet to be generated in the processing flow, since they are generated within the DAC and/or the following analog components (e.g., from nonlinear operation dominated by the relative high power and/or high power spectral density components comprising the signal). After the generation of the distortion in the DAC and/or the following analog components, the newly generated distortion is reduced and/or eliminated by the presence of the relatively small power synthesized distortion injected prior to the DAC. By effectively creating the additive inverse of the distortion introduced at and/or following the DAC, and injecting it before the DAC, distortion is substantially eliminated from the signal output following the DAC, and spurious emissions from a device performing such digital analog conversion may be significantly reduced.

It is noted that such an analog signal output from the DAC may be provided to any of a number of different modules, circuitries, etc. within a communication device in accordance with generating a signal to be launched into a communication channel. For example, such subsequent modules, circuitries, etc. may include a local oscillator, a mixer for effectuating frequency conversion such as up conversion, etc.

Considering an exemplary embodiment, consider a DAC operating with a clocking frequency of 2.3 Gsps (Gigasamples per second) and having a folding frequency of 1.15 GHz. In this illustrative embodiment, there are two 6 MHz wide channels centered at 850 MHz and at 900 MHz, respectively. The second harmonics are at 1700 MHz and 1800 MHz, respectively, and some third order intermodulation products are at 800 MHz and at 950 MHz, respectively. However, oftentimes the distortion products associated with a DAC are generated in a manner which results in their aliasing down in frequency to below the folding frequency. In this embodiment, the aliased second harmonics fall at 500 MHz and 600 MHz, respectively. Knowing that there are only the two channels, and knowing their respective center frequencies (and other characteristics such as bandwidth, etc.), the frequency location of some intermodulation products (perhaps aliased, though not in this example) and the aliased second order harmonics (or perhaps not aliased, but they are aliased in this example), the second order nonlinearity can be applied to the complex baseband embodiment of each of the channels and up-converted and spectrally inverted (both via digital operations in one possible embodiment as pictorially illustrated in FIG. 5 which is additionally described below using dashed lines for the filter and/or up-converter) when applicable (noting that the aliased harmonics in this example are spectrally inverted since the aliasing is caused by the actual second harmonics mixing with the clocking frequency from the low side, e.g., the harmonics are at frequencies lower than the clocking frequency) to synthesize the 2nd order distortion products of the two respective channels.

Filtering to isolate and/or separate the various $2^{nd}$ order distortion products (and/or aliased $2^{nd}$ order distortion products) may be applied, and each separated and/or isolated component may be operated with a different gain and phase, and other filtering, prior to injection into the SOI path. Higher order distortion products, aliased and non-aliased, are synthesized in the same fashion. For synthesizing intermodulation products of channels, the same complex baseband approach may be applied, operating on the product of the complex basebands, and/or the exponentiation of one or each of the complex basebands and then generating the product of them (for the higher order intermodulation products). Another embodiment uses an upconverted version of at least one of the modulated channels, rather than complex baseband, but repeating the same steps as just outlined. In this embodiment, as in the other, adjustment of the frequency location of each synthesized distortion component is required, via a frequency translation, prior to injection into the SOI.

Figure 5:
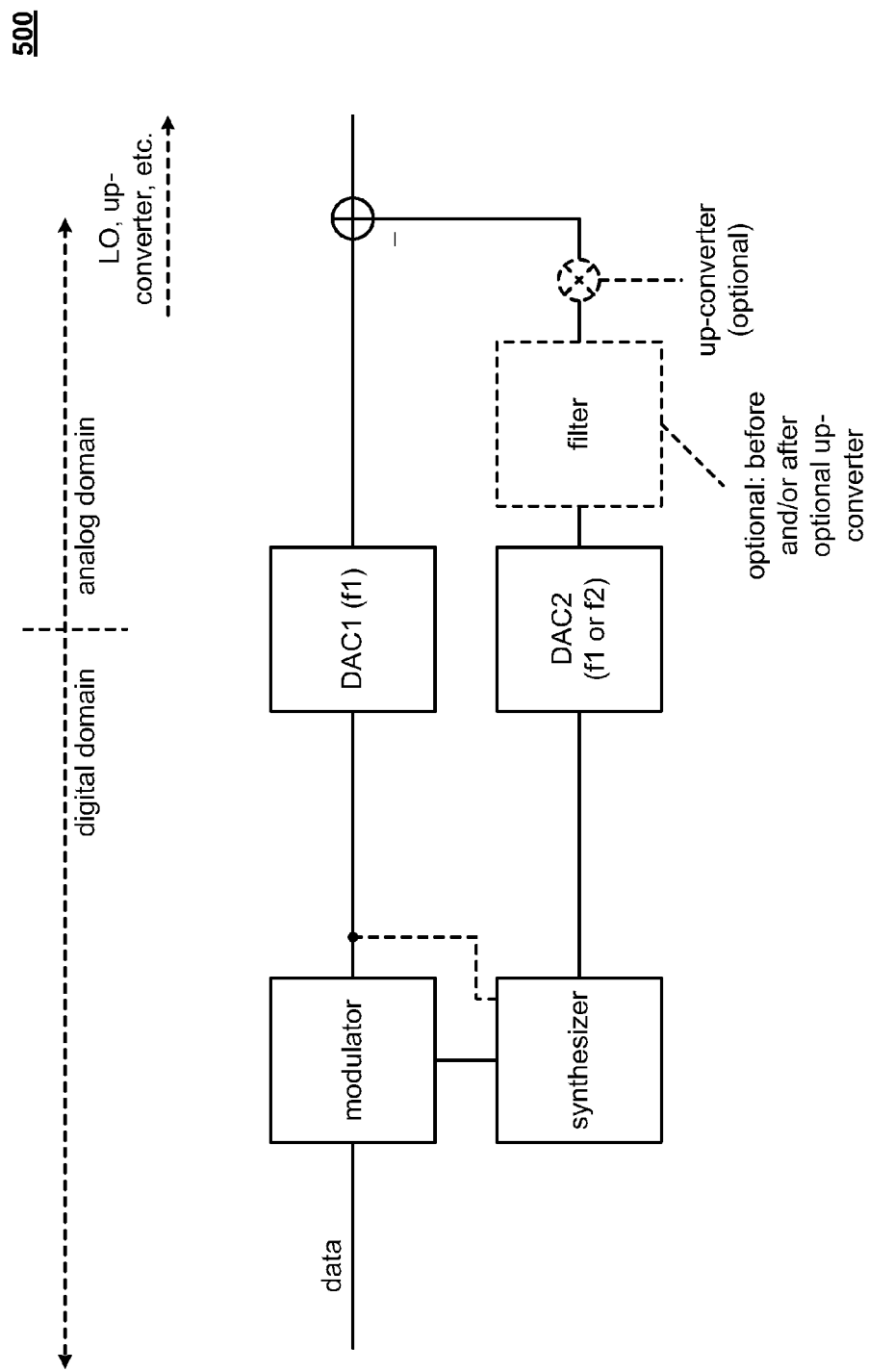
FIG. 5 illustrates an alternative embodiment of distortion synthesis for improving digital to analog conversion.

FIG. 5 illustrates an alternative embodiment 500 of distortion synthesis for improving digital to analog conversion. This diagram has some similarities to the previous embodiment with at least one difference being that two different digital to analog converters are employed. These two digital analog converters may operate at the same clocking (or equivalently, conversion or sampling) frequency, or the second DAC may operate at a different frequency than the first DAC. Generally speaking, in the art, it is noted that the frequency or rate at which a DAC operates is oftentimes loosely referred to as the sampling frequency or sampling rate, even though a signal is not being sampled in accordance with DAC operations, but a continuous time signal is instead being generated based on digital information.

In this diagram, instead of combining the one or more distortion terms with the signal that is output from the modulator, a second DAC is operative to generate an additional analog signal that is combined with the analog signal output from the first DAC. It is noted that the analog signal output from the second DAC is operative to reduce distortion within the analog signal output from the first DAC upon their combination.

As can be seen, at least one difference between this diagram (FIG. 5) and the previous diagram (FIG. 4) is that the distortion is effectively present in the signal generated by the first DAC within this diagram, after which it is reduced, while the distortion is effectively reduced at and/or before the DAC in the previous diagram. A designer is provided a great deal of latitude by which to implement the combination of signals to improve performance of spurious emission performance of a device operative to perform digital to analog conversion. It is noted that the second DAC may operate over a relatively narrower bandwidth than the first DAC, enabling a lower clocking rate for the second DAC in comparison with the first DAC. The output from the second DAC may be upconverted by analog means prior to combining with the output from the first DAC (as depicted using dotted or dashed lines in the diagram). The output from the second DAC may be lowpass filtered or bandpass filtered before and/or after upconversion, if any, prior to combining with the output of the first DAC. It is noted that the output of the second DAC may be many orders of magnitude lower power than the output of the first DAC, enabling reduction in complexity of this second DAC compared to the first DAC, especially if combined with lower clocking rate.

It is also noted that the power dissipation of operating the second DAC may be substantially lower than the power dissipation of operating the first DAC. Also, the peak voltage excursions of the second DAC may also be substantially lower than for the output of the first DAC, with associated savings in complexity, including the number of bits required for the digital codewords converted in the second DAC. Also, in some situations, the combining of the second DAC output with the first DAC output can involve insertion loss of the signal from the first DAC, but by employing an uneven combining ratio with more weight provided for the output of the first DAC, the insertion loss of the signal from the first DAC is reduced at the expense of requiring higher power for the output of the second DAC. It is also noted that the rate of occurrence of the peak power in the second DAC (or in the signal added to the primary signal, when the combining is prior to the DAC) is often low, occurring relatively infrequently; as such, the average power of this synthesized and adapted signal may be dominated by relatively few peak occurrences. Still, the second DAC often operates with substantially lower voltage excursions than the first DAC, and it is beneficial in some embodiments to heavily weight the output from the first DAC at the combiner, to reduce insertion loss on the first DAC output, and to then operate the second DAC at higher output levels corresponding to the reduced weighting this signal is provided in the combining.

Figure 6:
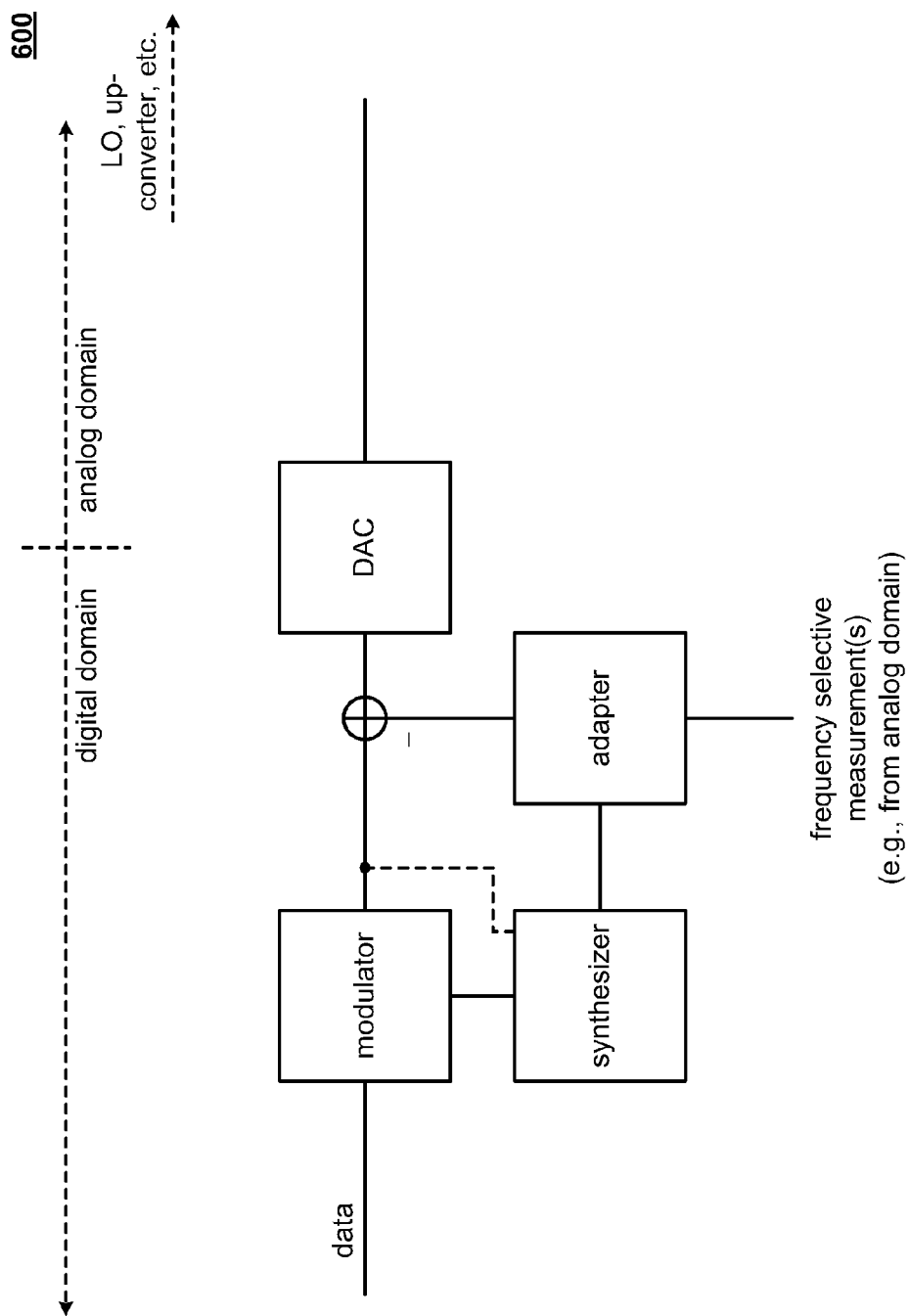
FIG. 6 illustrates an embodiment of distortion synthesis, including adaptation thereof, for improving digital to analog conversion including improving spurious emission performance.

FIG. 6 illustrates an embodiment 600 of distortion synthesis, including adaptation thereof, for improving digital to analog conversion including improving spurious emission performance. As shown in this diagram, an adapter is operative to modify one or more distortion terms as may be generated by a synthesizer. The adapter may be driven by one or more frequency selective measurements such as may be provided from the analog domain. For example, based upon processing of the analog signal generated by the DAC, and particularly based upon frequency selective measurements of that analog signal or derivations thereof, the adapter is implemented selectively to modify any distortion terms may be generated by the synthesizer.

As may be understood with respect to this diagram, the one or more distortion terms as may be provided from the synthesizer need not necessarily be only predetermined or fixed values, but they may be modified and tailored particularly for a given application.

It is noted that such an adapter as may be implemented within this diagram as well as different adapters that may be implemented within other diagrams and/or embodiments may be implemented to perform a variety of functions. For example, such an adapter may be implemented to perform adaptation of any one of filtering, gain, phase, delay adjustment, etc. That is to say, such an adapter may be implemented to perform modification of any one or more distortion terms provided from the synthesizer in accordance with a variety of different operations.

Within the embodiment of this diagram as well as within embodiments corresponding to other diagrams herein, it is noted that the frequency selective measurements provided to the adapter may be provided via one or more components implemented within a common device. That is to say, such frequency selective measuring component may be implemented within the very same device including those components employed to effectuate such digital to analog conversion. Alternatively, such frequency selective measurements may be provided by one or more components external to the device actually performing the digital to analog conversion. For example, with respect to an embodiment making frequency selective power measurements, a spectrum analyzer may be implemented within the device or a communication there with. In some instances, an analog to digital converter (ADC) may be implemented to sample the analog signal output from the DAC thereby generating a digital signal corresponding to that analog signal for subsequent processing and analysis thereof. Generally speaking, any of a variety of implementations may be effectuated for providing at least one frequency selective measurement for use by an adapter such as implemented within this or other embodiments.

Generally speaking, an active nonlinear distortion mitigation technique may be implemented by performing such adaptation of one or more distortion terms provided from a synthesizer.

As described with respect to this diagram and other diagrams and/or embodiments herein, in accordance with performing such active distortion cancellation, a measurement of one or more critical fidelity characteristics of the output signal (e.g., the analog signal output from the DAC or a signal derived there from) is employed to guide the adaptive distortion cancellation as effectuated by the one or more distortion terms provided from the synthesizer and adapted by the adapter. For example, such frequency selective measurements which may be taken in the analog domain are employed to drive the adaptation of the one or more distortion terms provided from the synthesizer.

In some embodiments, such adaptation of the one or more distortion terms, and/or respective coefficients associated therewith, may be performed in accordance with performing dithering as an alternative to performing a least mean square (LMS) algorithm. That is to say, such an architecture as presented herein that is operative to provide such frequency selective measurements may not necessarily provide a true error signal. That is to say, certain frequency selective measurements, such as frequency selective power measurements, are not directly applicable for use in accordance with the LMS algorithm. For example, the fact that such an architecture as presented herein does not provide suitable error signal that may be used in accordance with the LMS algorithm, dithering may alternatively be performed that is driven by appropriate timing of the dithering and of the frequency selective measurements. Techniques for converging adaptive tap coefficients as an alternative to the LMS algorithm, e.g., gradient steepest descent, may be employed. Isolating one tap at a time for adjustment, and/or employing dithering algorithms for testing the result, and then moving, or retaining, the most recent tap coefficient value are among dithering algorithms which may be employed in applications such as this (e.g., with respect to certain U.S. utility patent applications, U.S. patents, and/or references incorporated by reference above as identified by 4, 4.1, 5, and 5.1).

It is also noted that there may be certain difficulty in observing and measuring one or more fidelity components which are to be optimized. This may be caused by a number of reasons including the oftentimes difficult requirement of achieving an acceptably high transmit power. Also, the fidelity requirement, such as the unwanted distortion terms, are oftentimes specified to be at extremely low levels compared to the transmit power of the communication device. This relatively large difference between the transmit power and the signal level at which measurements need to be made can be challenging. For example, the measured signal of interest may span a relatively large dynamic range including being very strong and also falling near the measurement noise floor (e.g., being relatively very small). Moreover, different applications will require different amounts of distortion which may be allowed at various frequencies.

It is again noted that the synthesis of the one or more distortion terms can be implemented in any of a variety of ways. One implementation corresponds to mitigating the second-order harmonic distortions that alias down in frequency (especially below the lowest signal frequency where requirements can be the most challenging, such as in DRFI), and also given the consideration that the DACs with acceptably low complexity have the most difficulty meeting the requirements when there are relatively few active channels, an approach where each pair of active channels is used to generate the corresponding second order distortion product (aliased as may be done by the DAC) may be viewed as having relatively limited complexity. As the number of active channels is increased, such an approach may scale more than linearly in complexity, but in certain cases, mitigation may no longer be necessary. For application to devices with relatively lower sampling rates in the primary DAC (e.g., the DAC implemented along the signal of interest path) using the full RF signal (or some intermediate version beyond baseband) for synthesis of the one or more distortion terms may be more acceptable.

Figure 7:
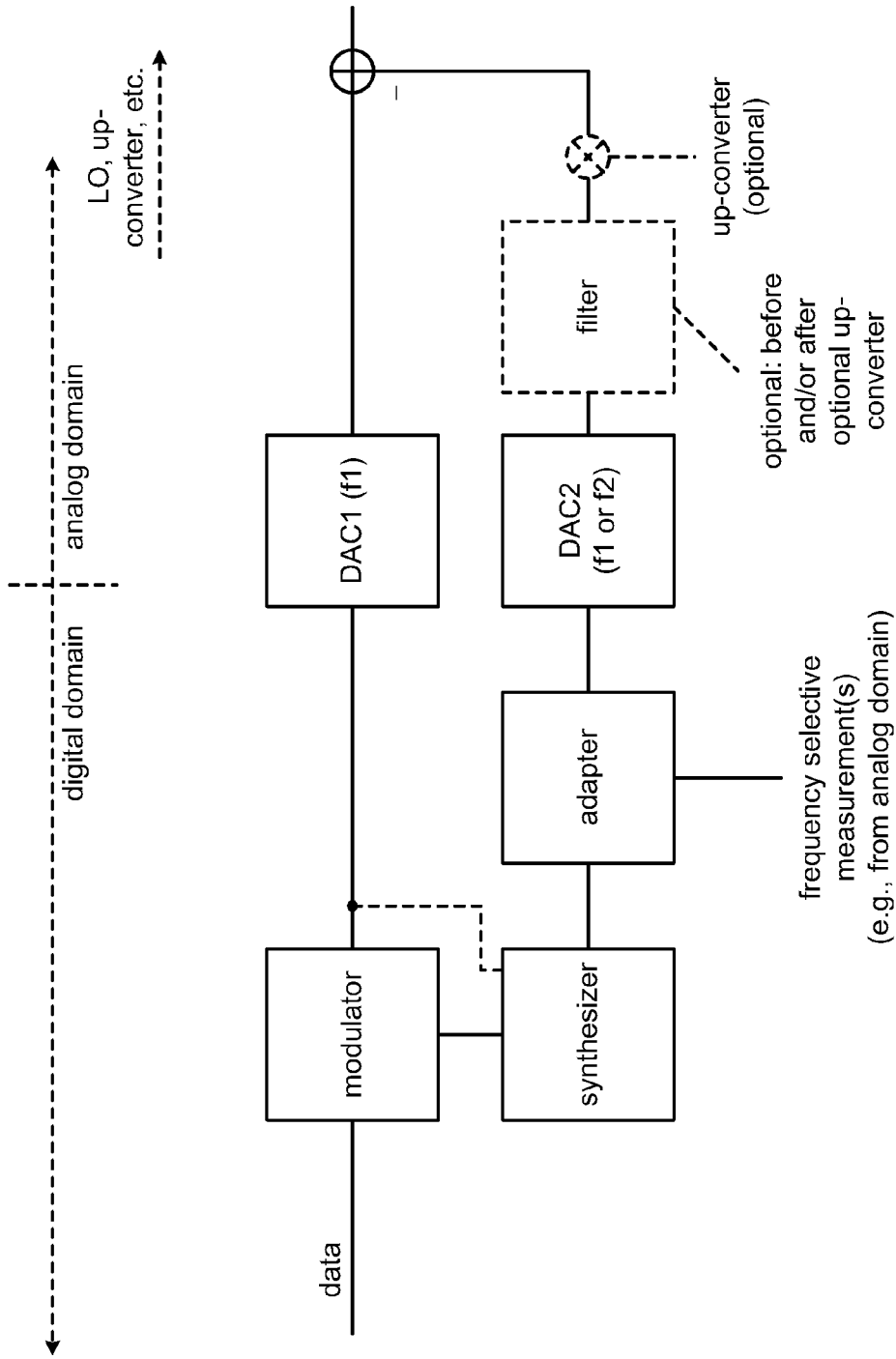
FIG. 7 illustrates an alternative embodiment of distortion synthesis, including adaptation thereof, for improving digital to analog conversion including improving spurious emission performance.

FIG. 7 illustrates an alternative embodiment 700 of distortion synthesis, including adaptation thereof, for improving digital to analog conversion including improving spurious emission performance. As can be seen when comparing this diagram to the previous diagram, two separate DACs, which may operate at the same or different frequencies, are implemented such that one or more distortion terms as may be provided from a synthesizer, and which may be adapted by an adapter [whose operation may be driven by one or more frequency selective measurements] are employed by a second DAC to generate a second analog signal that is combined with a first analog signal output from the first DAC.

Again, designers are provided a great deal of latitude by which to implement the combination of signals to improve performance of spurious emissions in accordance with performing digital to analog conversion. This diagram illustrates adaptation of one or more distortion terms in conjunction with distortion reduction being performed by combination of signals within the analog domain. That is to say, the distortion of the first analog signal output from the first DAC is effectuated via combination with a second analog signal output from the second DAC that corresponds to the one or more distortion terms provided by the synthesizer, which may have undergone adaptation in accordance with one or more frequency selective measurements such as may be performed within the analog domain.

Figure 8:
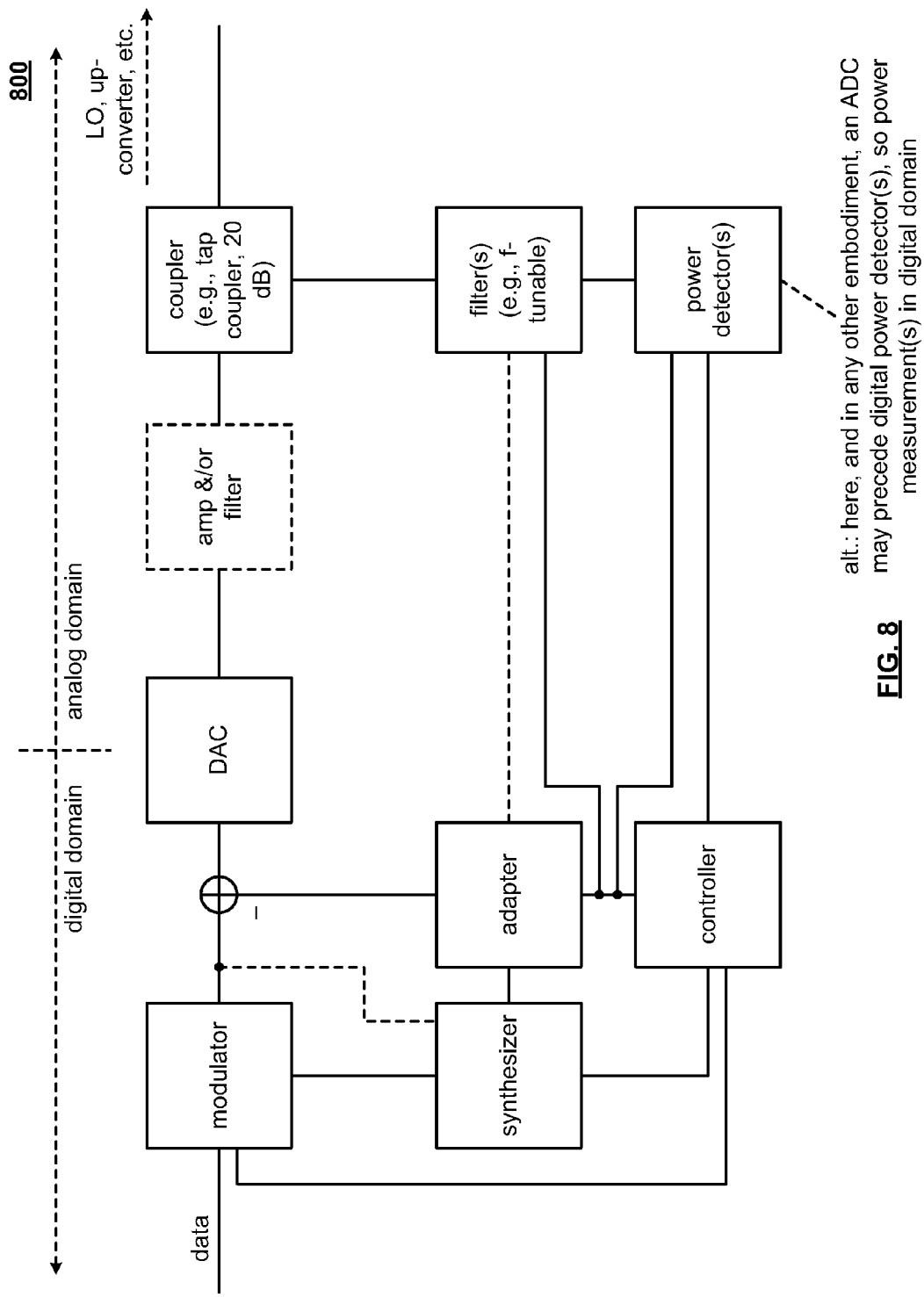
FIG. 8 and FIG. 9 illustrate other alternative embodiments of distortion synthesis, including adaptation thereof, for improving digital to analog conversion including improving spurious emission performance.
Figure 9:
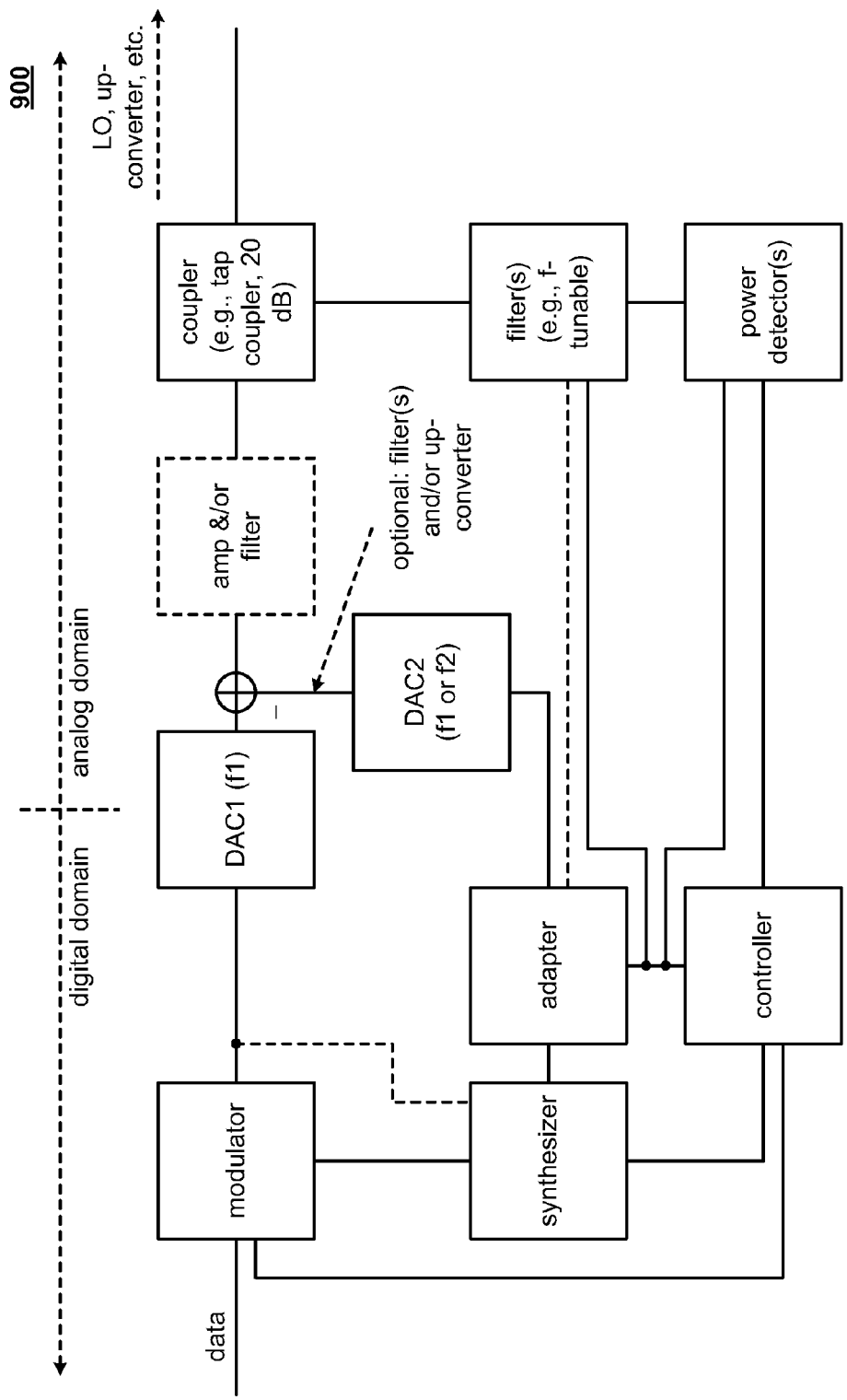

FIG. 8 and FIG. 9 illustrate other alternative embodiments 800 and 900, respectively, of distortion synthesis, including adaptation thereof, for improving digital to analog conversion including improving spurious emission performance.

Referring to embodiment 800 of FIG. 8, as can be seen with respect to this diagram, an adapter is implemented to modify one or more distortion terms as may be provided from a synthesizer based upon control and/or information provided from one or more other components. In this diagram, an amplifier and/or filter may be implemented after the DAC in the analog domain to perform various processing of the analog signal output from the DAC. All embodiments need not necessarily include such an amplifier and/or filter. A coupler is implemented to provide an analog signal representative of the analog signal to be provided down the analog domain processing chain (e.g., as the SOI). Such a coupler may be a tap coupler having some specified operational parameter such as tapping a signal in accordance with a certain power ratio (e.g., 20 dB). The signal provided from the coupler is provided to one or more filters. A singular filter having frequency selective capability may be employed. In such an embodiment, a frequency selective filter is operative to sweep among a number of different frequencies thereby selectively outputting particular portions of the signal provided via the coupler. As may be understood, at any particular time, a certain spectral component of the signal provided from the coupler may be output from such a frequency selective filter.

Alternatively, a number of filters may be implemented such that each respective filter has a corresponding tuning characteristic. In such an embodiment, each of these respective filters is operative to output a particular spectral component of the signal provided from the coupler. Depending upon which output is selected from which of the number of filters, and the desired spectral component of the signal provided from the coupler may be output from such a filter bank.

One or more power detectors is/are implemented to make power measurements corresponding to the outputs from the one or more filters. Somewhat analogous to various embodiments by which one or more filters may be implemented, a singular power detector may be implemented to measure power provided from a singular frequency selective filter, such that different power measurements made at different times correspond respectively to different frequency spectral component of the signal provided from the coupler via such a frequency selective filter. Alternatively, a number of power detectors may be implemented in an embodiment including a number of filters such that each respective power detector is implemented to measure power of a signal provided from a respective one of the filters. That is to say, such an embodiment may correspond to a one-to-one relationship between the number of filters and the number of power detectors such that each power detector corresponds to one filter, and vice versa. In another embodiment, an alternative implementation and/or equivalent of a tunable filter may be employed using an adjustable local oscillator tone and a mixer, or even a two mixer approach such as heterodyne.

Regardless of the particular implementation of one or more filters and/or one or more power detectors, such respective frequency selective power measurements are provided to a controller. For example, a controller is implemented to coordinate operation of the various respective components within such a device. For example, such a controller is operative to receive such frequency selective power measurements and to direct the operation of the synthesizer and the adapter based thereon. Also, the controller is operative to direct the operation of the one or more filters and the one or more power detectors as well.

As can be seen with respect to this diagram, adaptation as may be performed by the adapter, and particularly as driven by the controller, is effectuated based upon frequency selective measurements corresponding to an analog signal generated by the DAC. In this diagram, such frequency selective measurements are made within the analog domain and provided to a controller for driving adaptation within the digital domain. It is noted that such a controller may include a combination of digital and analog components therein for effectuating interaction between the respective analog and digital domains.

Referring to embodiment 900 of FIG. 9, as can be seen with respect to this diagram in comparison to the previous diagram, two separate DACs (which may operate at the same or different frequencies) are employed such that distortion is reduced from the analog signal output from the first DAC by combination of another analog signal output from the second DAC. As can be seen within this diagram as well as other diagrams, one or more filters and/or one or more of converters may optionally be implemented to process the signal by second DAC. Generally speaking, within this embodiment 900 and within other diagrams and/or embodiments, certain modules, functional blocks, circuitries, etc. may optionally be included within alternative embodiments (e.g., sometimes pictorially illustrated by dotted or dashed lines). Again, as described with respect to multiple other embodiments herein, reduction of distortion may be effectuated within the digital domain via modification of a signal that is provided to a DAC, or reduction of distortion may be effectuated within the analog domain via modification of the signal output from the DAC.

While many of the previous diagrams and embodiments are directed towards reducing or eliminating the deleterious effects of spurious emissions as may be encountered in accordance with digital analog conversion, certain of the subsequent diagrams and embodiments deal respectively with improving transition band performance and stopband performance corresponding to digital to analog conversion. Also, certain subsequent embodiments are directed towards providing for additional skirt and/or spectral mask performance in accordance with such digital to analog conversion.

Figure 10:
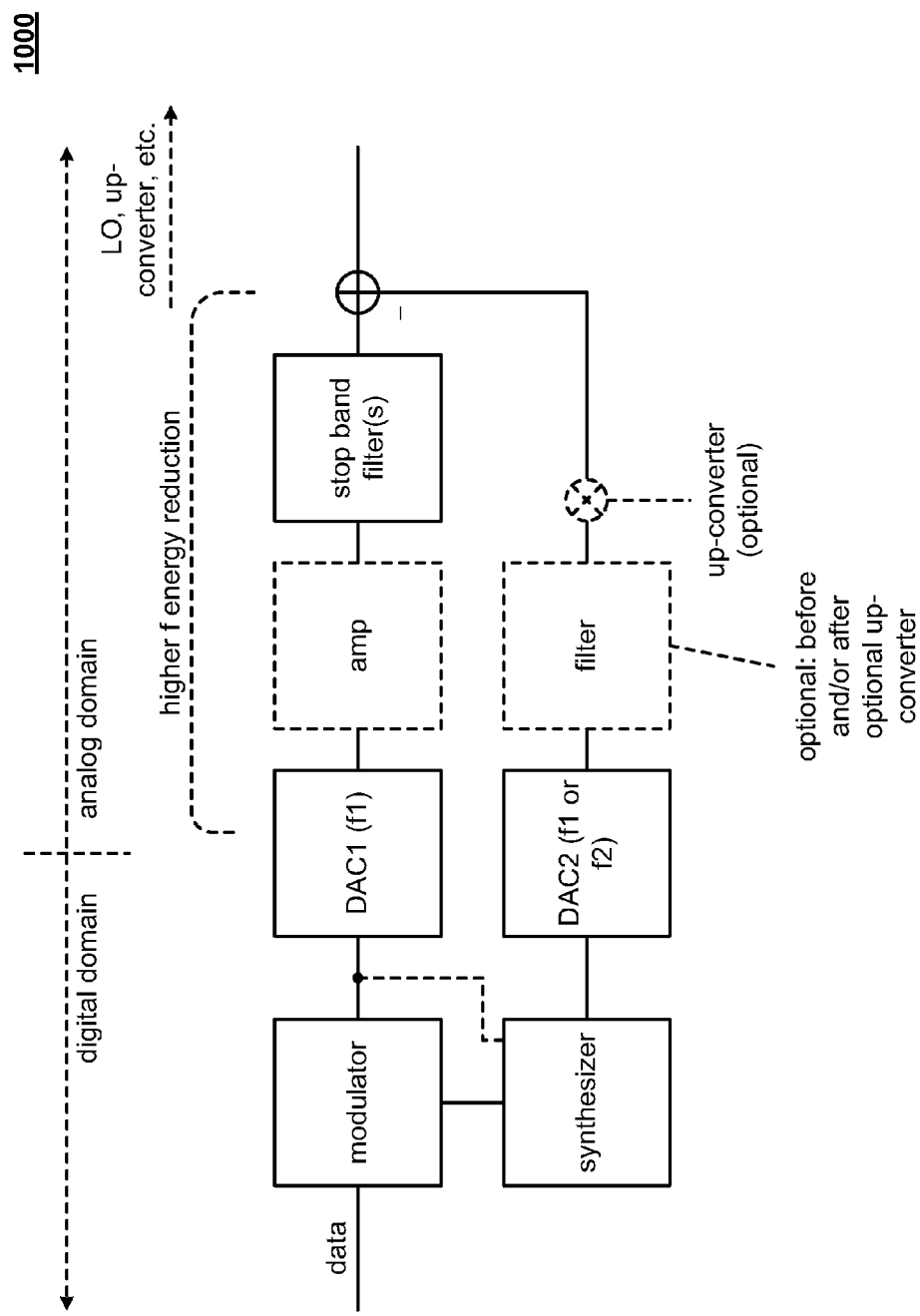
FIG. 10 illustrates an embodiment of distortion synthesis for improving digital to analog conversion including improving transition band and/or stopband performance.

FIG. 10 illustrates an embodiment 1000 of distortion synthesis for improving digital to analog conversion including improving transition band and/or stopband performance. As can be seen with respect to this diagram, two separate DACs (which may operate at the same or different frequencies) are employed such that one or more distortion terms as provided by a synthesizer are used to generate an additional analog signal output from the second DAC. Along the processing chain output from the first DAC, an amplifier may be implemented between the output of the first DAC and one or more stopband filters. In addition, an up-converter may be implemented with respect to the output of the second DAC to perform certain operations such as up frequency conversion (e.g., such as in accordance with frequency up conversion as particularly illustrated). Of course, certain embodiments need not include such frequency conversion functionality for processing the analog signal output from the second DAC.

Sometimes, a digital signal that is provided to a DAC for conversion to an analog signal has frequency characteristics corresponding to a relatively flat frequency response up to some particular frequency, $f_u$, such that this particular frequency is below the Nyquist folding frequency (e.g., $f_s/2$) associated with the sampling frequency (e.g., $f_s$) by which the DAC operates. That is to say, assuming that the frequency at which the DAC operates is $f_s$, then the relatively flat frequency response of the digital signal extends up to $f_u$ such that $f_u < f_s/2$. Oftentimes, there is another frequency, $f_{sb}$, which may be higher than the Nyquist folding frequency, $f_{sb} > f_s/2$, which is the lower frequency of a stopband, or may be at or below the Nyquist folding frequency.

For certain applications, which may include being compliant within certain requirements related to emissions and/or noise immunity requirements, the power spectral density or some other characteristic associated with a measure of spurious emissions within a communication device (e.g., such as taken via a measurement from at least one component following the DAC, which may be a measurement taken at the output of a transmitter communication device) may be required to have attenuation below a given threshold at frequencies greater than this other frequency, $L_b$. For example, certain applications require a communication device to operate in accordance with a certain degree of electromagnetic compatibility, such that emissions and/or noise immunity requirements of the device must be below a particular threshold. As can be seen, the frequencies between the upper edge of the signal passband (e.g., $f_u$) and the lower edge of the stopband (e.g., $f_{sb}$) may be viewed as constituting a transition band. Employing a digital filter can improve the performance in the transition band, such as by providing for more attenuation. However, the inclusion of such a digital filter can increase complexity and may sometimes unfortunately introduce filtering distortion (e.g., by providing a non-flat amplitude and group delay variation (GDV)) to the signal and the passband.

Alternatively, one or more stopband filters may be implemented subsequent to the DAC, such as depicted with respect to this diagram. In some instances, depending on how close are the respective frequencies corresponding to the upper edge of the signal passband (e.g., $f_u$) and the lower edge of the stopband (e.g., $f_{sb}$), as well as the Nyquist folding frequency, $f_s/2$, such a stopband filter as implemented within the analog domain may unfortunately introduce insertion loss (e.g., by reducing power from the DAC output) and may also add additional amplitude and GDV filtering distortion.

A second DAC is implemented such that the energy between various respective frequencies can be reduced (e.g., (1) the energy between the upper edge of the signal passband, $f_u$, and the Nyquist folding frequency, $f_s/2$, (2) the energy from the Nyquist folding frequency, $f_s/2$, to the lower edge of the stopband, $f_{sb}$, as well as (3) the energy within some range higher than the lower edge of the stopband, $f_{sb}$, [between $f_{sb}$ some $f > f_{sb}$]). That is to say, with such interference distortion cancellation techniques in accordance with the various approaches presented herein, and their equivalents, the energy within certain particular frequency ranges can be reduced. Such implementation may be implemented using digital and/or analog filters as also referred to above. That is to say, such interference distortion cancellation techniques may be employed in combination with or separately from such digital and/or analog filters.

The additional reduction of signal energy in the transition band may operate to relax the requirements on any such implemented digital and/or analog filters. Such a relaxation can enable the achievement of much more narrow transition bands and/or substantially less filtering distortion in the passband and/or much more stopband attenuation. As the reader will understand, such an implementation may reduce the complexity of a given device while allowing for better stopband attenuation and smaller transition bands. By providing for better stopband attenuation, much more efficient network operation may be achieved, such as in accordance with a communication system application, in that, a communication device will still introduce relatively less noise into adjacent frequency bands during transmission of signals. By providing for operation of relatively smaller transition bands, the overall network efficiency may be increased by allowing for greater use of the spectrum. As may be understood, by ensuring relatively more narrow transition bands, more frequency spectra is available for use for other communications. It is also noted that the use of such relatively smaller transition bands may further reduce implementation complexity, in addition to that which is referenced above, by allowing for the use of relatively lower sampling rates within a DAC. For example, the sampling rate of the DAC is oftentimes increased to provide for more oversampling in response to the inherent limitations of digital and/or analog filters in supporting the attenuation needed at the lower edge of the stopband, $f_{sb}$, within allowed or acceptable amount of filter distortion below the upper edge of the signal passband, $f_u$.

Figure 11:
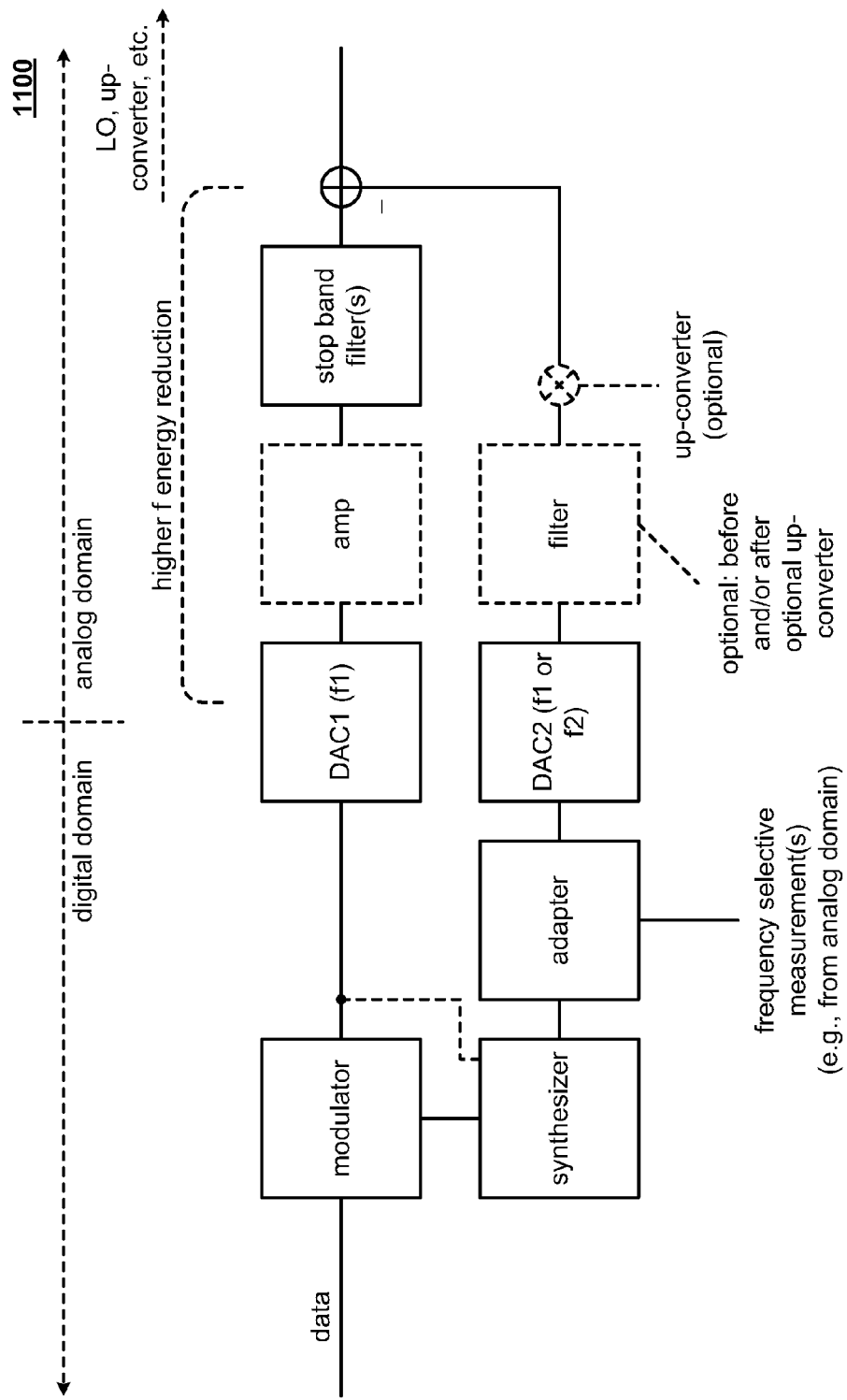
FIG. 11 illustrates an embodiment of distortion synthesis, including adaptation thereof, for improving digital to analog conversion including improving transition band and/or stopband performance.

FIG. 11 illustrates an embodiment 1100 of distortion synthesis, including adaptation thereof, for improving digital to analog conversion including improving transition band and/or stopband performance. As can be seen with respect to this diagram, adaptation may be performed with respect to one or more distortion terms provided by the synthesizer for use by the second DAC in generating the second analog signal. As may also be understood with respect to other diagrams and embodiments described herein, such adaptation may be made with respect to frequency selective measurements including those taken within the analog domain and related to the analog signal generated by the first DAC or signals generated or derived therefrom.

Figure 12:
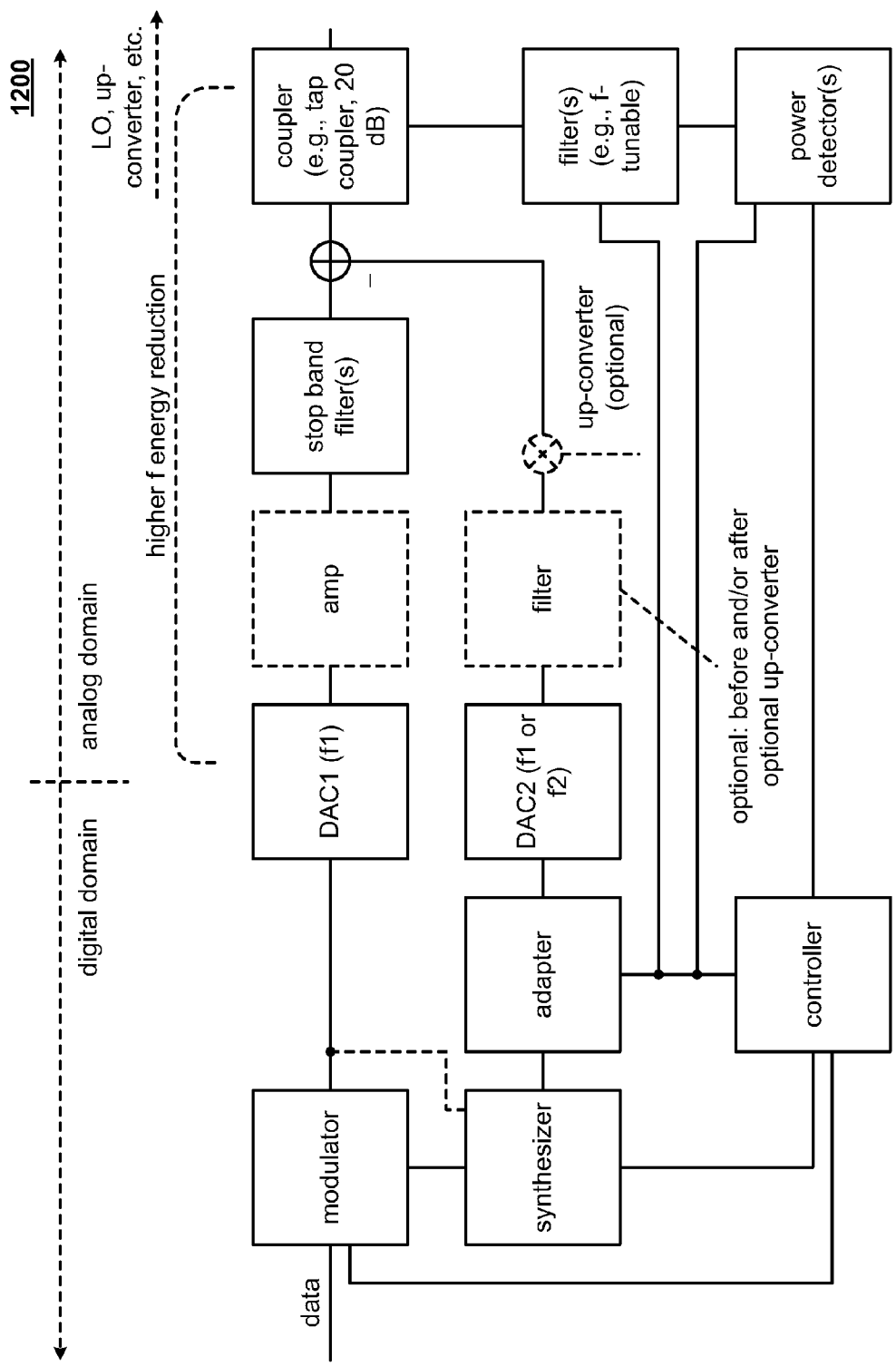
FIG. 12 illustrates an alternative embodiment of distortion synthesis, including adaptation thereof, for improving digital to analog conversion including improving transition band and/or stopband performance.

FIG. 12 illustrates an alternative embodiment 1200 of distortion synthesis, including adaptation thereof, for improving digital to analog conversion including improving transition band and/or stopband performance.

As can be seen with respect to this diagram, a coupler, one or more filters (e.g., which may have frequency selective capability), one or more power detectors, and a controller are implemented to direct the operation of various components including that of the adapter. Generally speaking, an adapter is implemented to modify one or more distortion terms as may be provided from a synthesizer based upon control and/or information provided from one or more other components. In this diagram, an amplifier may be implemented after the first DAC in the analog domain, after the first DAC and before the one or more stopband filters, to perform various processing of the analog signal output from the first DAC. All embodiments need not necessarily include such an amplifier.

A coupler is implemented to provide an analog signal representative of the analog signal to be provided down the analog domain processing chain. As described also with respect to other embodiments herein, such a coupler may be a tap coupler having some specified operational parameter such as tapping a signal in accordance with a certain power ratio (e.g., 20 dB). The signal provided from the coupler is provided to one or more filters. A four port device could combine the combining function and the coupling function adjacent to each other in the figure. A singular filter having frequency selective capability may be employed. In such an embodiment, a frequency selective filter is operative to sweep among a number of different frequencies thereby selectively outputting particular portions of the signal provided via the coupler. As may be understood, at any particular time, a certain spectral component of the signal provided from the coupler may be output from such a frequency selective filter.

Alternatively, a number of filters may be implemented such that each respective filter has a corresponding tuning characteristic. In such an embodiment, each of these respective filters is operative to output a particular spectral component of the signal provided from the coupler. Depending upon which output is selected from which of the number of filters, and the desired spectral component of the signal provided from the coupler may be output from such a filter bank.

One or more power detectors is/are implemented to make power measurements corresponding to the outputs from the one or more filters. Somewhat analogous to various embodiments by which one or more filters may be implemented, a singular power detector may be implemented to measure power provided from a singular frequency selective filter, such that different power measurements made at different times correspond respectively to different frequency spectral component of the signal provided from the coupler via such a frequency selective filter. Alternatively, a number of power detectors may be implemented in an embodiment including a number of filters such that each respective power detector is implemented to measure power of a signal provided from a respective one of the filters. That is to say, such an embodiment may correspond to a one-to-one relationship between the number of filters and the number of power detectors such that each power detector corresponds to one filter, and vice versa.

Regardless of the particular implementation of one or more filters and/or one or more power detectors, such respective frequency selective power measurements are provided to a controller. For example, a controller is implemented to coordinate operation of the various respective components within such a device. For example, such a controller is operative to receive such frequency selective power measurements and to direct the operation of the synthesizer and the adapter based thereon. Also, the controller is operative to direct the operation of the one or more filters and the one or more power detectors as well.

As can be seen with respect to this diagram, adaptation as may be performed by the adapter, and particularly as driven by the controller, is effectuated based upon frequency selective measurements corresponding to an analog signal generated by the second DAC. In this diagram, such frequency selective measurements are made within the analog domain and provided to a controller for driving adaptation within the digital domain. It is noted that such a controller may include a combination of digital and analog components therein for effectuating interaction between the respective analog and digital domains.

As may be understood with respect to this diagram, the use of one or more stopband filters along the chain processing the analog signal output from the first DAC is operative to reduce energy within certain portions of the frequency spectrum. For example, such as described further above, the energy within certain portions of the frequency spectrum such as (1) the energy between the upper edge of the signal passband, $f_u$, and the Nyquist folding frequency, $f_s/2$, (2) the energy from the Nyquist folding frequency, $f_s/2$, to the lower edge of the stopband, $f_{sb}$, as well as (3) the energy within some range higher than the lower edge of the stopband, $f_{sb}$, [between $f_{sb}$ some $f>f_{sb}$] may be reduced. Again, as also described elsewhere herein, by allowing for operation using relatively smaller transition bands, greater use of the available frequency spectrum may be achieved. Also overall network efficiency may be increased, at least in part, because of these relatively smaller transition bands. Moreover, relatively lower sampling rates may be employed by one or more DACs within such a device, and relatively lower implementation complexity may be achieved.

Certain of the following diagrams are directed towards improving skirt and/or spectral mask performance. For example, within a communication device operative to perform transmission of one or more signals via one or more communication links, certain applications require the characteristics of certain spectral masks to be in accordance with certain constraints (e.g., meeting certain federal communications commission (FCC) regulations for wireless communications). Generally speaking, skirt and/or spectral mask performance may be implemented in accordance with synthesizing one or more distortion terms and adding it to the signal of interest path in an effort to reduce the deleterious distortion effects therein. In certain embodiments, the one or more distortion terms may be adapted (e.g., such as in accordance with the least squared error (LSE) criterion), which may be based upon one or more frequency selective measurements such as provided from the analog domain.

In accordance with improving skirt and/or spectral mask performance, the synthesis of one or more distortion terms may be implemented by applying an AM-AM and AM-PM characteristic (e.g., an embodiment of which is pictorially illustrated with respect to FIG. 22). Such a characteristic may be viewed as being an estimate of the characteristic memoryless nonlinearity that the signal path is subjected to. In certain of embodiments, this characteristic may be adapted based upon feedback (e.g., from frequency selective measurements). As may be understood, the one or more distortion terms, such as provided from a synthesizer, may also be adapted based upon such frequency selective measurements. Generally speaking, such applications are directed towards the instance in which the Nyquist folding frequency (e.g., $f_s/2$) is relatively much wider than the available bandwidth of interest. For example, within a communication system application, the Nyquist folding frequency (e.g., $f_s/2$) may be viewed as being relatively much wider than the available transmission bandwidth by which communications may be made. Such improvement to the skirt and/or spectral mask performance may be achieved whether the skirt(s)/mask(s) are relatively much lower than the Nyquist folding frequency (e.g., $f_s/2$) or whether one of the skirt(s)/mask(s) is within the transition band as described above with respect to those embodiments directed towards reducing energy within certain respective frequency ranges.

Figure 13:
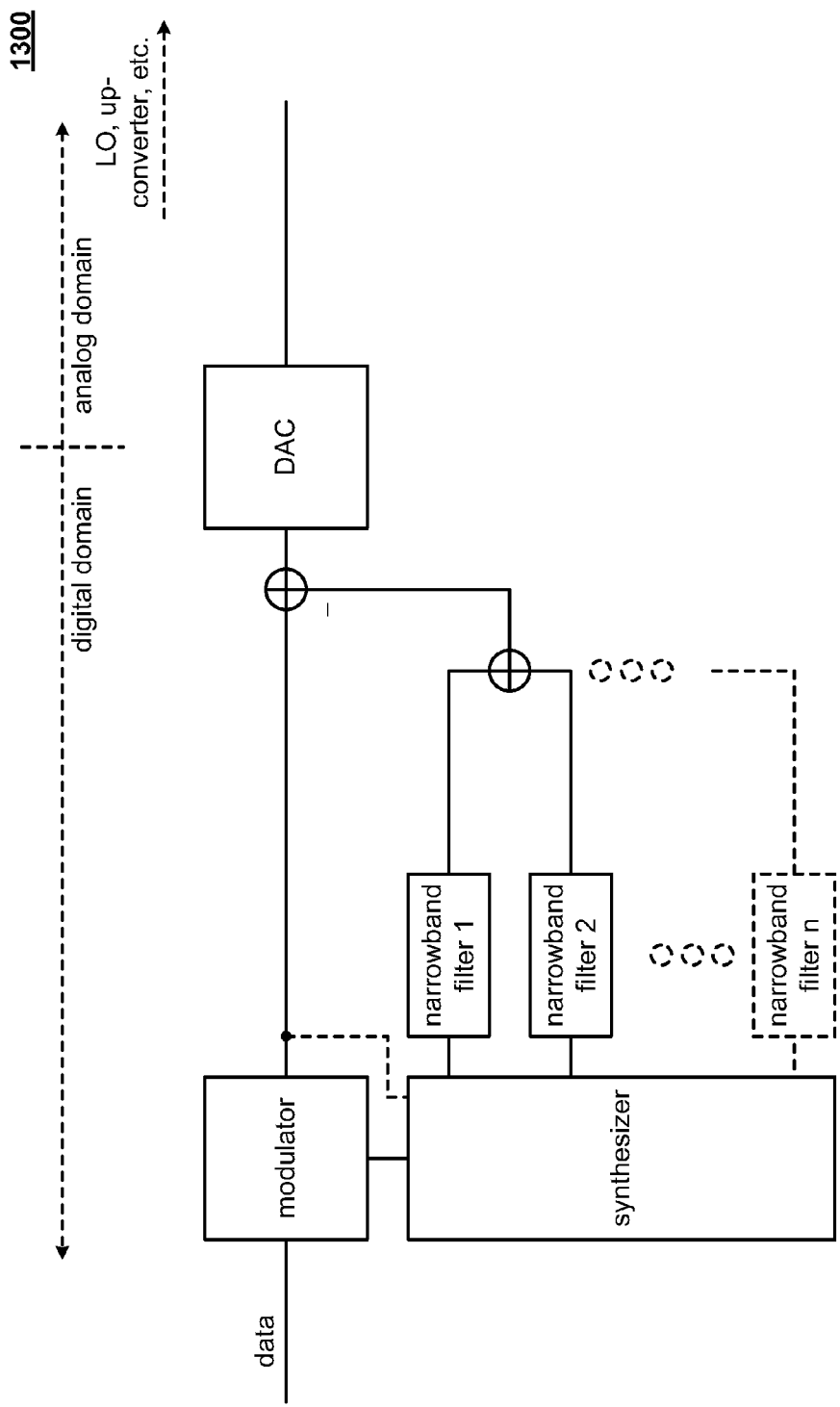
FIG. 13 illustrates an embodiment of distortion synthesis for improving digital to analog conversion including improving skirt and/or spectral mask performance.

FIG. 13 illustrates an embodiment 1300 of distortion synthesis for improving digital to analog conversion including improving skirt and/or spectral mask performance. Skirt and/or spectral mask requirements can be applicable at frequencies below the Nyquist folding frequency. As such, part of the synthesized skirt and/or spurious emissions (within the spectral mask's associated frequencies) may be injected prior to the primary (SOI) DAC to reduce the skirt and/or spurious emissions within the spectral mask, as when reducing aliased and non-aliased harmonics and intermodulation distortion. Each skirt and spectral mask region may be isolated and synthesized separately, though complete separation is not necessary in all applications. As can be seen with respect to this diagram, a number of narrowband filters receive respective outputs from the synthesizer. In this diagram, the outputs from the respective narrowband filters are summed together and combined with the signal output from the modulator before being provided to the DAC. Each respective narrowband filter may operate in accordance with different characteristics. For example, the respective narrowband filters may have different respective frequency responses, attenuations, etc. such that the one or more distortion terms generated by the synthesizer are handled differently.

Figure 14:
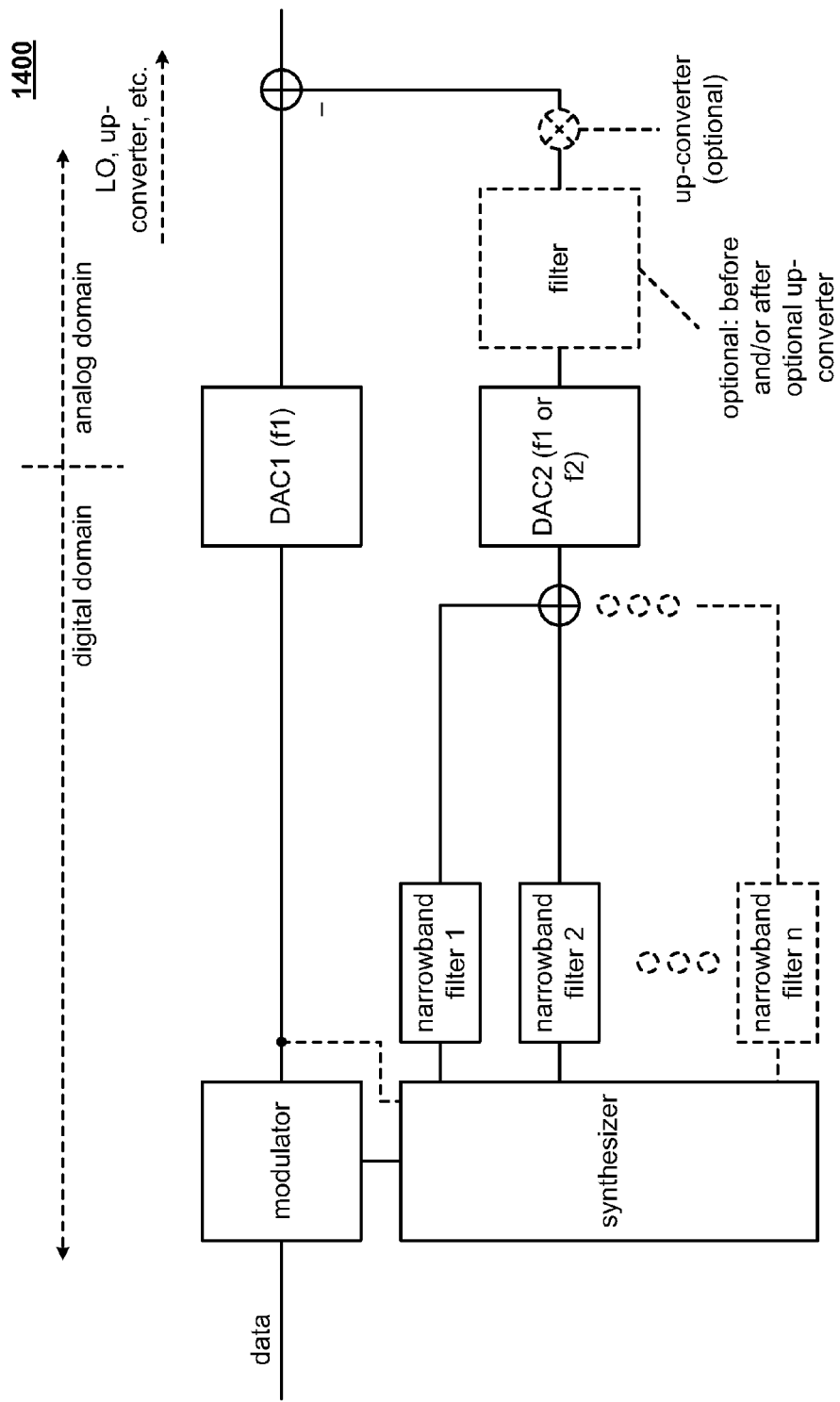
FIG. 14 illustrates an alternative embodiment of distortion synthesis for improving digital to analog conversion including improving skirt and/or spectral mask performance.

FIG. 14 illustrates an alternative embodiment 1400 of distortion synthesis for improving digital to analog conversion including improving skirt and/or spectral mask performance. As can be seen with respect to this diagram in comparison to the previous diagram, a first DAC and a second DAC, which may operate at the same frequency or at different frequencies, receives the outputs from the respective narrowband filters, after having been summed together. As such, the analog signal generated from the second DAC corresponds to the combination of the outputs from the respective narrowband filters. The analog signal provided from the second DAC is combined with the analog signal output from the first DAC.

Within this diagram and other embodiments that employ a second DAC for generating a second analog signal that is combined with the first analog signal output from the first DAC, it is noted that the output power of the second DAC may be generally less than the output power of the first DAC. In some instances, an amplifier is implemented to modify the analog signal output from the first DAC; however, even within such instances, the output power of the second DAC may be less than the output power of the first DAC.

Figure 15:
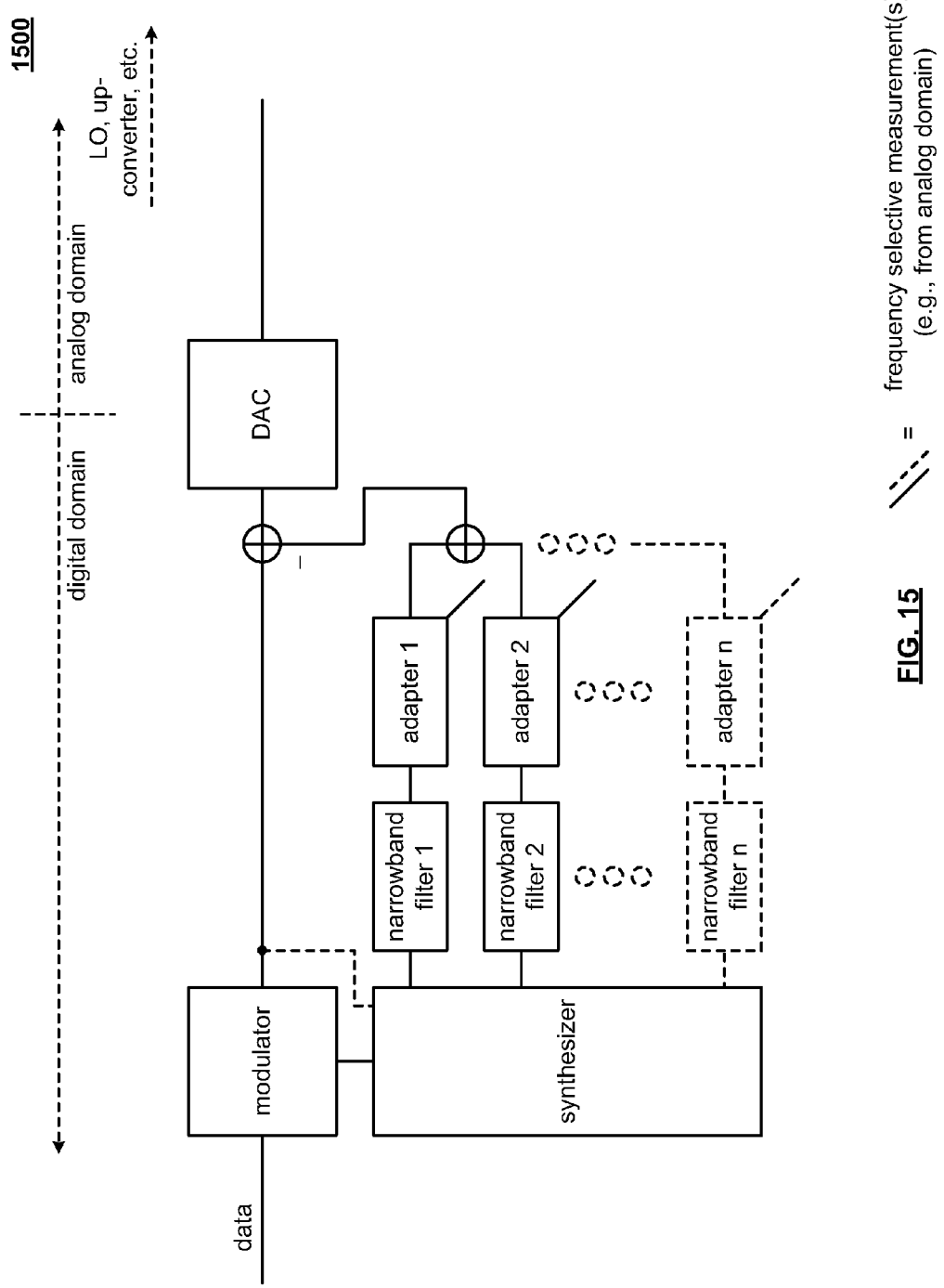
FIG. 15 illustrates an embodiment of distortion synthesis, including adaptation thereof, for improving digital to analog conversion including improving skirt and/or spectral mask performance.

FIG. 15 illustrates an embodiment 1500 of distortion synthesis, including adaptation thereof, for improving digital to analog conversion including improving skirt and/or spectral mask performance. As can be seen with respect to this diagram, multiple respective outputs are provided from the synthesizer to a number of narrowband filters. Each respective narrowband filter provides its output to a corresponding respective adapter. The operation of the adapters may be performed based upon one or more frequency selective measurements such as may be made within the analog domain. Different respective control signals may be provided to each respective adapter such that each one operates independently from the other spectral band adaptive coefficients and based upon the respective frequency selective measurements associated with the spectral band of the narrowband filter all along that particular processing path. That is to say, each respective adapter may be adjusted independently with respect to the other adapters based upon frequency selective measurements associated with its respective spectral band of influence.

In this particular diagram, the outputs from the respective adapters are summed together and combined with the signal output from the modulator before being provided to the DAC.

Figure 16:
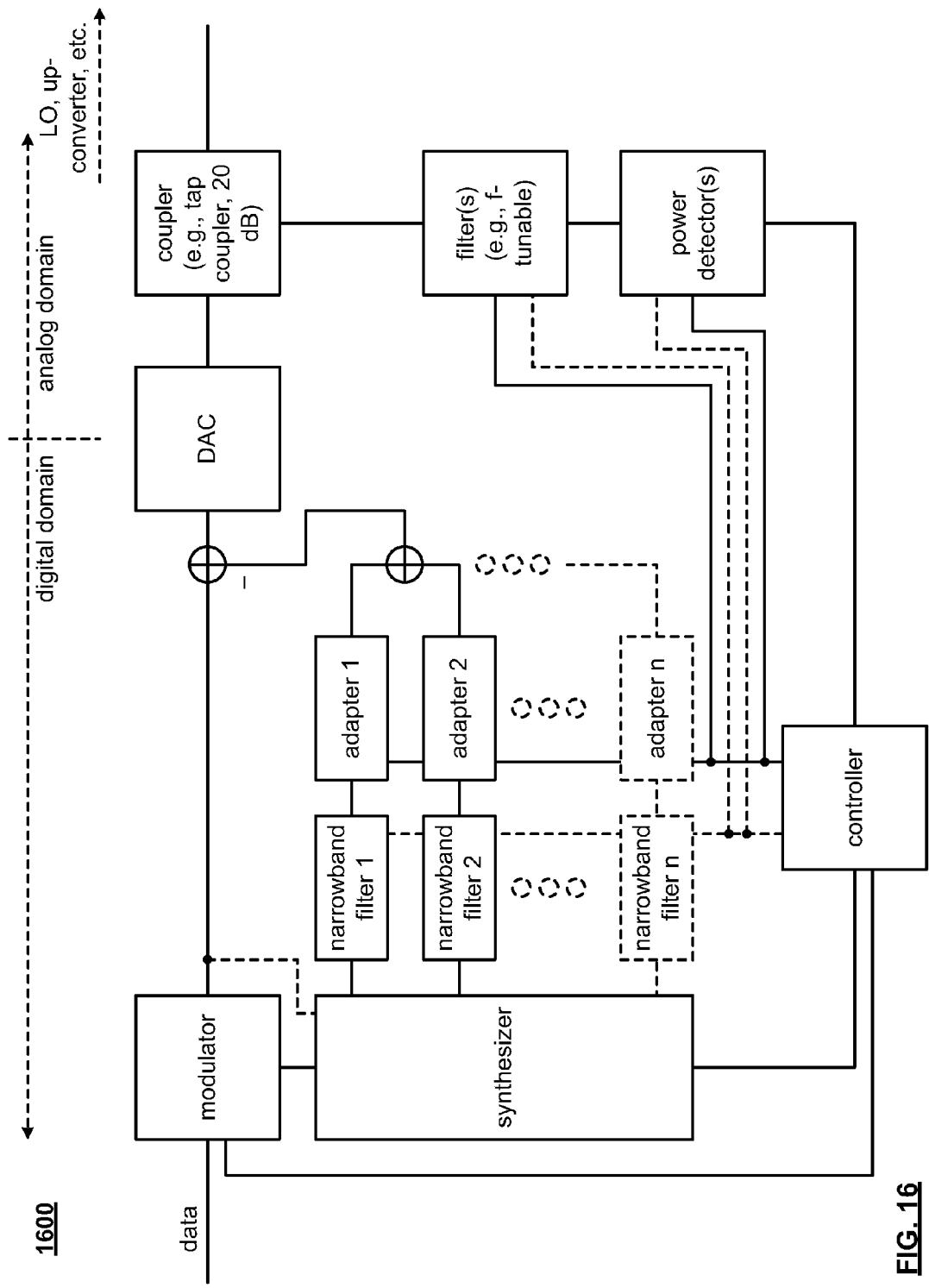
FIG. 16 illustrates an alternative embodiment of distortion synthesis, including adaptation thereof, for improving digital to analog conversion including improving skirt and/or spectral mask performance.

FIG. 16 illustrates an alternative embodiment 1600 of distortion synthesis, including adaptation thereof, for improving digital to analog conversion including improving skirt and/or spectral mask performance. As can be seen with respect to this diagram in comparison to the previous diagram, a coupler, one or more filters (e.g., which may have frequency selective capability), one or more power detectors, and a controller are implemented to direct the operation of various components including that of the respective adapters. For example, the operation of the respective adapters may be adjusted based on direction from the controller. In some instances, the controller is also operative to direct the operation of the respective narrowband filters. For example, the frequency responses, attenuations, etc. of the respective narrowband filters may be adjusted based upon direction from the controller.

The reader is referred to other diagrams and/or embodiments included herein that described the operation of such couplers, one or more filters (such as those being frequency selective), etc. such as is described elsewhere herein.

Figure 17:
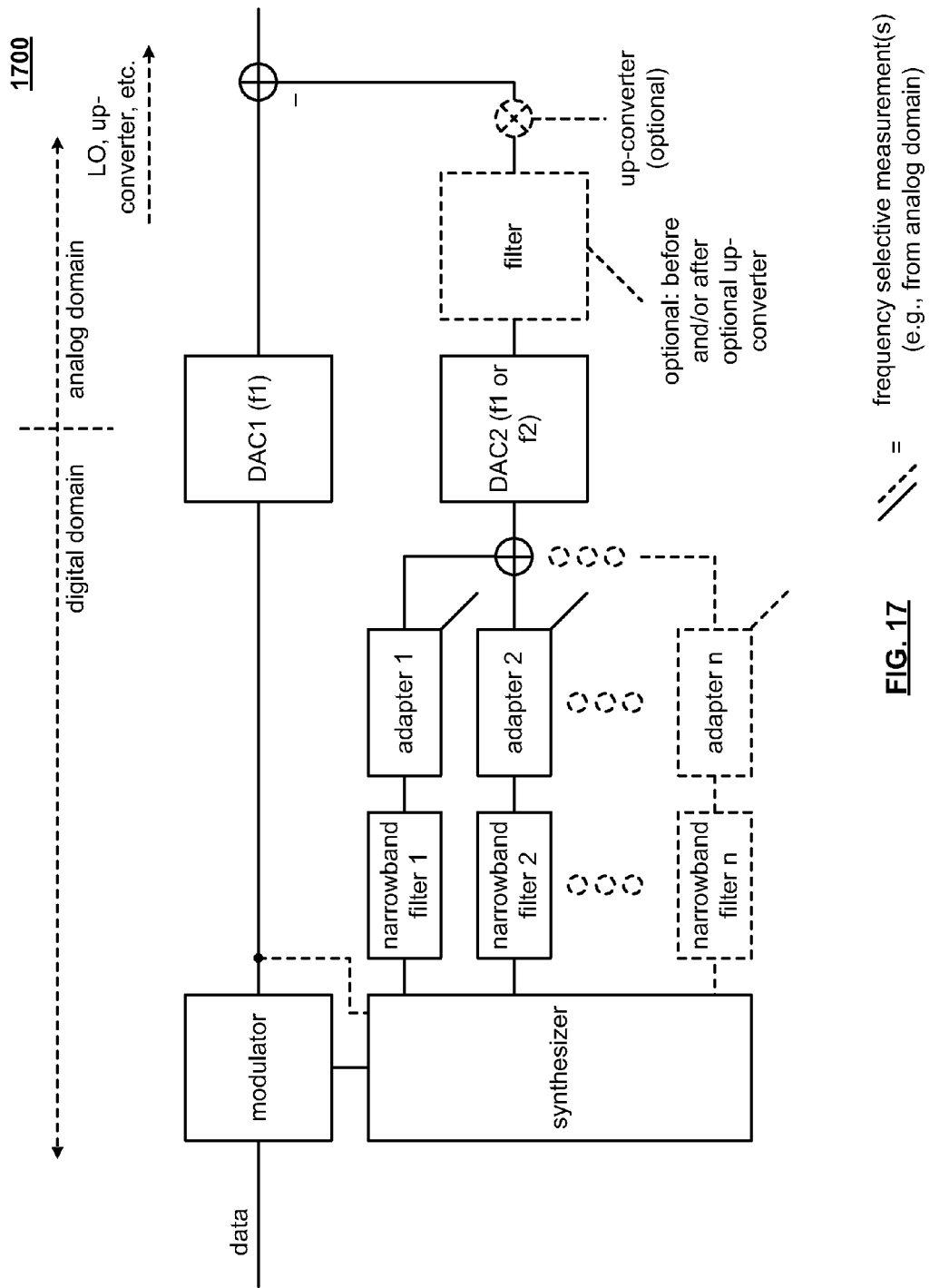
FIGS. 17 and 18 illustrate other alternative embodiments of distortion synthesis, including adaptation thereof, for improving digital to analog conversion including improving skirt and/or spectral mask performance.
Figure 18:
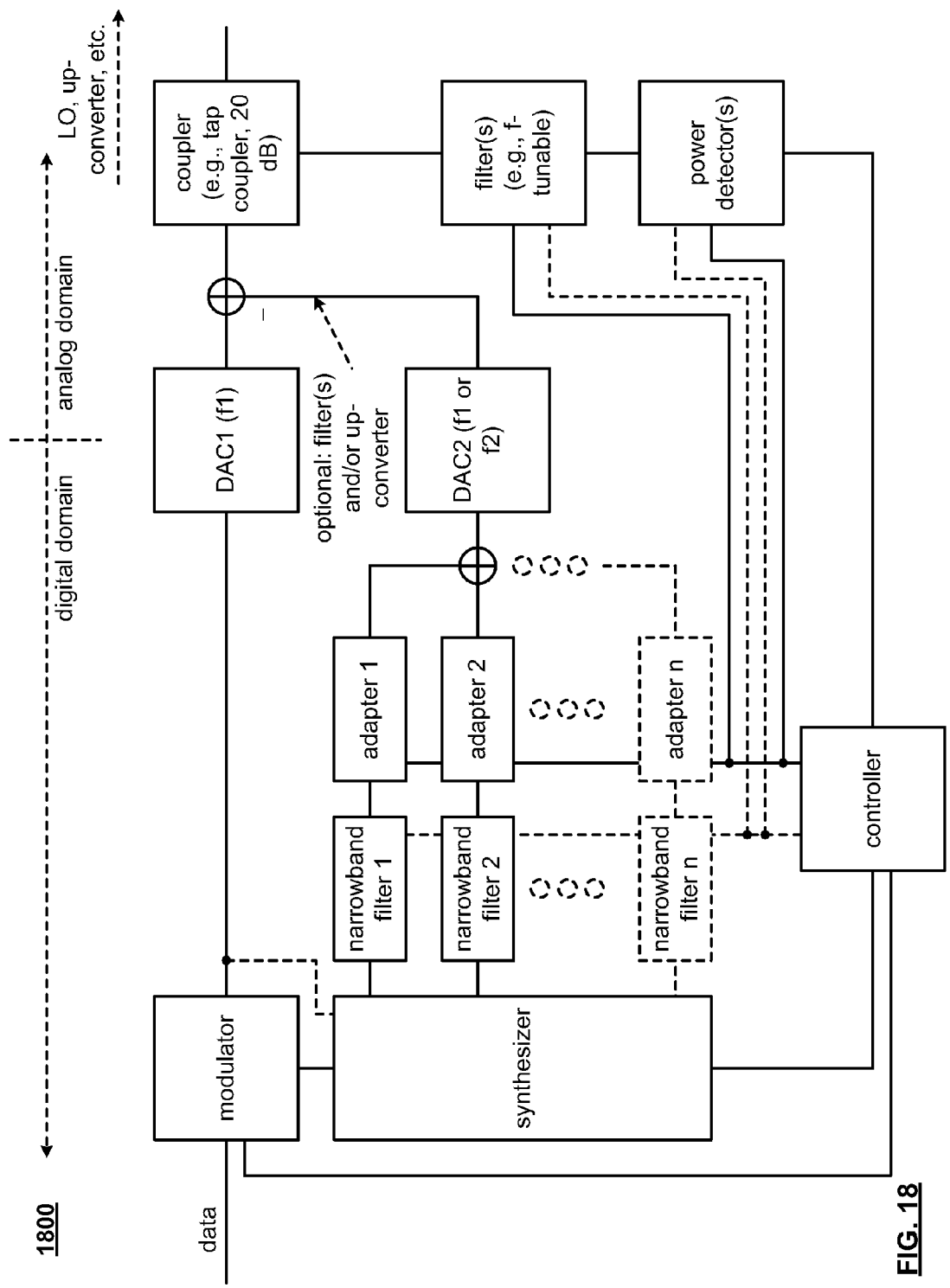

FIGS. 17 and 18 illustrate other alternative embodiments 1700 and 1800, respectively, of distortion synthesis, including adaptation thereof, for improving digital to analog conversion including improving skirt and/or spectral mask performance.

Referring to embodiment 1700 of FIG. 17, as can be seen with respect to this diagram, the outputs from the multiple adapters are summed together and provided to a second DAC operative to generate a second analog signal that is combined with the analog signal output from the first DAC. It is noted that the respective adapters may operate based upon certain frequency selective measurements such as may be provided from the analog domain.

Referring to embodiment 1800 of FIG. 18, as can be seen with respect to this diagram, in comparison to the previous diagram, a coupler, one or more filters (e.g., which may have frequency selective capability), one or more power detectors, and a controller are implemented to direct the operation of various components including that of the respective adapters. For example, the operation of the respective adapters may be adjusted based on direction from the controller. In some instances, the controller is also operative to direct the operation of the respective narrowband filters. For example, the frequency responses, attenuations, etc. of the respective narrowband filters may be adjusted based upon direction from the controller.

The reader is referred to other diagrams and/or embodiments included herein that described the operation of such couplers, one or more filters (such as those being frequency selective), etc. such as is described elsewhere herein.

Figure 19:
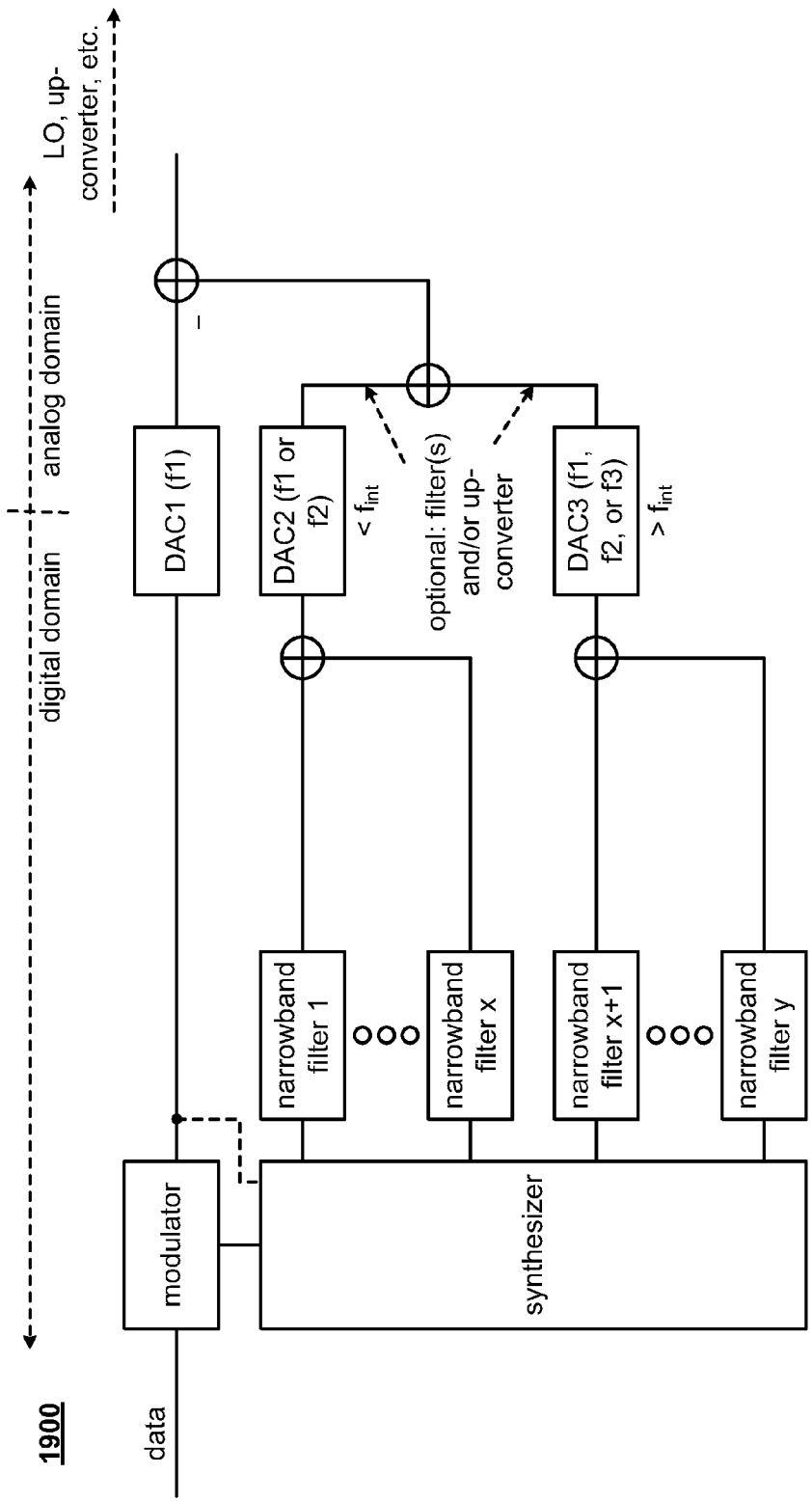
FIG. 19 illustrates an embodiment of distortion synthesis, including adaptation thereof and separately compensating for frequencies above and below, respectively, of a signal of interest, for improving digital to analog conversion including improving skirt and/or spectral mask performance.

FIG. 19 illustrates an embodiment 1900 of distortion synthesis, including adaptation thereof and separately compensating for frequencies above and below, respectively, of a signal of interest, for improving digital to analog conversion including improving skirt and/or spectral mask performance. With respect to this diagram, three separate DACs are implemented. A first DAC is implemented along the main processing line, in accordance with generating an analog signal from the codewords provided from the modulator. A second DAC is implemented to generate a second analog signal based upon the summed outputs from a first subset of the narrowband filters. This second DAC corresponds to those signal components below a particular signal of interest (e.g., below a particular frequency of interest, $f_{int}$).

Analogously, a third DAC is implemented to generate a third analog signal based upon the second outputs from a second subset of the narrowband filters. This third DAC corresponds to those signal components above that particular signal of interest (e.g., above $f_{int}$). The respective analog signals output from the second DAC and the third DAC are combined, and that resulting combination is then combined with the output from the first DAC.

Generally speaking, the narrowband filter synthesized outputs are summed together according to their respective spectral position in comparison to that of the signal along the main processing path (e.g., the signal path extending from the modulator to the first DAC). For example, the relatively high side frequency outputs are summed together, and the relatively low side frequency outputs are summed together. That is to say, a first subset of the narrowband filters corresponds to the relatively high side frequency, and a second subset of the narrowband filters corresponds to the relatively low side frequency. As can be seen with respect to the diagram, the two respective summed signals are passed to their own respective DACs. It is noted that the second DAC and the third DAC may operate at different frequencies than the first DAC. For example, the second DAC and the third DAC may operate at relatively low lower rates than the first DAC. Also, various frequency conversion (e.g., up conversion), may be performed before or after summation within the different respective subsets, or alternatively after generation of the respective analog signals output from the second back in the third DAC.

As can be seen with respect to this diagram, an AM-AM and AM-PM characteristic is employed to model the one or more distortion terms (e.g., an embodiment of which is pictorially illustrated with respect to FIG. 22). That is to say, such an architecture may be viewed as modeling one or more channels in accordance with such a characteristic to synthesize the one or more distortion terms.

Figure 20:
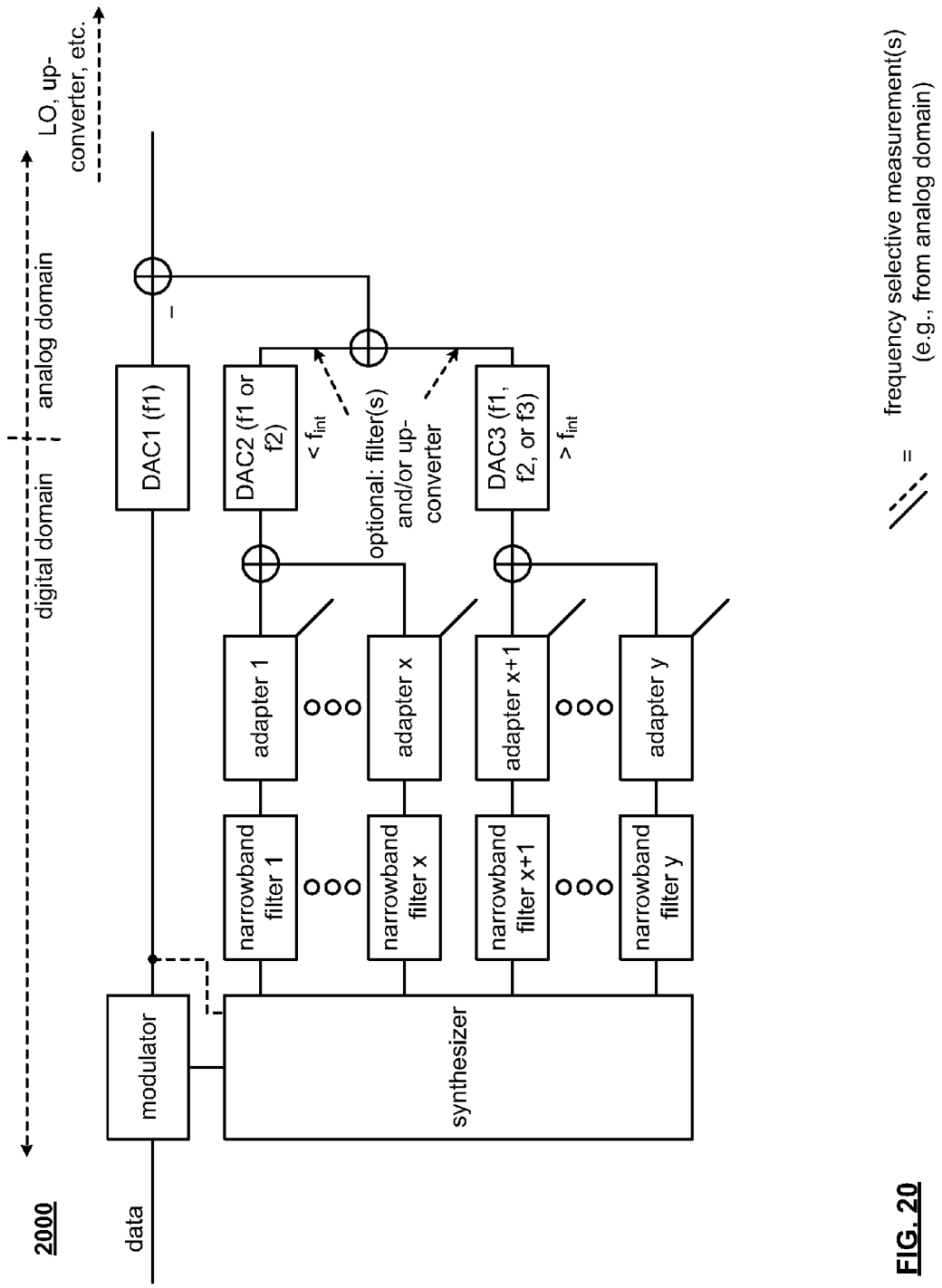
FIG. 20 and FIG. 21 illustrate alternative embodiments of distortion synthesis, including adaptation thereof and separately compensating for frequencies above and below, respectively, of a signal of interest, for improving digital to analog conversion including improving skirt and/or spectral mask performance.
Figure 21:
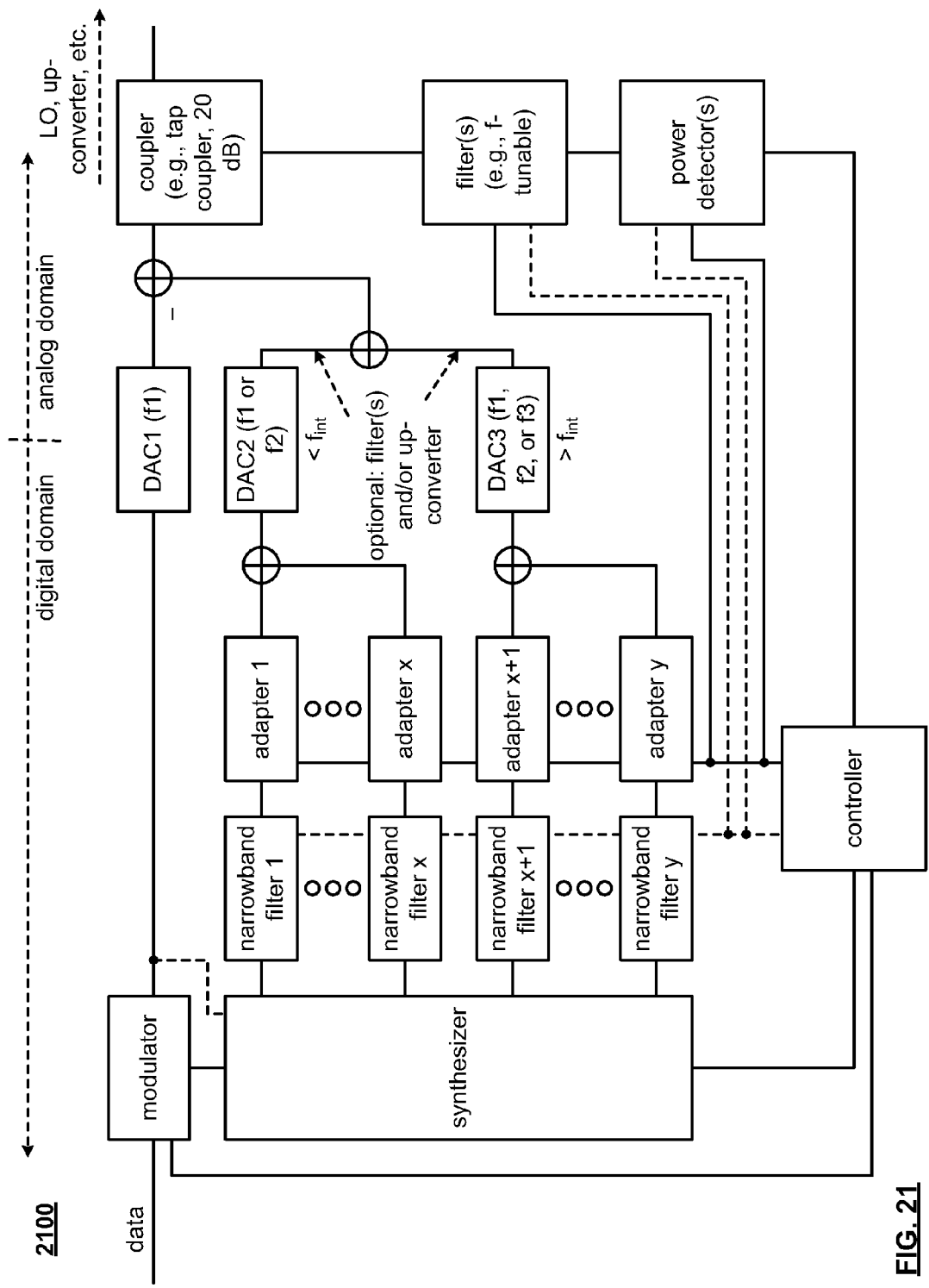

FIG. 20 and FIG. 21 illustrate alternative embodiments 2000 and 2100, respectively, of distortion synthesis, including adaptation thereof and separately compensating for frequencies above and below, respectively, of a signal of interest, for improving digital to analog conversion including improving skirt and/or spectral mask performance.

Referring to embodiment 2000 of FIG. 20, as may be seen with respect to this diagram, three separate DACs are implemented as with respect to the previous diagram. In this diagram, a first DAC is a political of main processing line, and a second DAC and a third DAC are implemented with respect to and corresponding to those signal components above and below the particular signal of interest (e.g., above and below $f_{int}$), and a number of adapters are implemented such that the output from each respective narrowband filter is provided to a corresponding and respective adapter.

As can be seen with respect to this diagram, multiple respective outputs are provided from the synthesizer to a number of narrowband filters. Each respective narrowband filter provides its output to a corresponding respective adapter. The operation of the adapters may be performed based upon one or more frequency selective measurements such as may be made within the analog domain. Different respective control signals may be provided to each respective adapter such that each one operates independently from the other spectral band adaptive coefficients and based upon the respective frequency selective measurements associated with the spectral band of the narrowband filter all along that particular processing path. That is to say, each respective adapter may be adjusted independently with respect to the other adapters based upon frequency selective measurements associated with its respective spectral band of influence.

In addition, it can be seen that the narrowband filters and adapters are partitioned into at least two groups such that a first subset of the narrowband filters and adapters correspond to those signal component below a particular signal of interest (e.g., $<f_{int}$). A second subset of the narrowband filters and adapters correspond to those signal complements above that particular signal of interest (e.g., $>f_{int}$).

In this particular diagram, within each respective subset of the narrowband filters and adapters, the outputs from those adapters within that subset are summed together and combined before being provided to that respective DAC (e.g., outputs from a first subset of the adapters are summed together and provided to the second DAC, and outputs from a second subset of the adapters are summed together and provided to the third DAC). The respective analog signals output from the second DAC and the third DAC are combined, and that resulting combination is then combined with the output from the first DAC.

Referring to embodiment 2100 of FIG. 21, as can be seen with respect to this diagram, in comparison to the previous diagram, a coupler, one or more filters (e.g., which may have frequency selective capability), one or more power detectors, and a controller are implemented to direct the operation of various components including that of the respective adapters. For example, the operation of the respective adapters may be adjusted based on direction from the controller. In some instances, the controller is also operative to direct the operation of the respective narrowband filters. For example, the frequency responses, attenuations, etc. of the respective narrowband filters may be adjusted based upon direction from the controller.

The reader is referred to other diagrams and/or embodiments included herein that described the operation of such couplers, one or more filters (such as those being frequency selective), etc. such as is described elsewhere herein.

In even another embodiment, after the coupler, the energy of the signal of interest passband may be reduced prior to the error power filtering and measurement operations such as performed using one or more filters, one or more power detectors, etc. This may be reduced by differencing the signal that is coupled away from the signal of interest path prior to an amplifier that may be implemented within that path. Such a signal of interest picked off prior to such an amplifier may be amplified (yet to a relatively lower amount than would be employed by the actual transmitter output) and delay adjusted adaptively to minimize the power in the resulting combination. Such additional components can provide for a reduction of the signal of interest power when the measurements are made for driving the adaptive distortion cancellation. Reducing the signal of interest power in such an active, adaptive manner may be more desirable than standalone filtering in terms of providing more accurate measurements within certain embodiments. For example, sense relatively large signal of interest power can be problematic to error power measurements, especially near error measurement bands, such a reduction of the signal of interest power may be desirable in such embodiments.

FIG. 22 illustrates an embodiment 2200 of amplitude modulation-amplitude modulation (AM-AM) characteristics and AM-phase modulation (AM-PM) characteristics. As can be seen with respect to this diagram, the relationships between an input amplitude and output amplitude and introduced phase are sometimes depicted with respect to AM-AM and AM-PM characteristics, especially for bandpass signals undergoing power amplification to high levels of output power. For example, with respect to AM-AM characteristics, there is a relatively linear relationship between input and output amplitude (e.g., relatively near the origin) until the input amplitude exceeds a given value after which the output amplitude generally remains at a maximum value. For example, when the input amplitude is relatively large, the output amplitude will correspondingly generally not exceed a maximum value.

As can be seen with respect to AM-PM characteristics, there is a relatively negative linear relationship between input amplitude and output phase (e.g., having a negative relatively linear slope), by which an output phase negatively follows the input amplitude in accordance with such a negative relationship. As can be seen, the relative slope of the curve increases as a function of an increased input amplitude, corresponding to increased delay as the amplitude is increased. The reader is referred to the technical literature for additional material information as may be understood with respect to AM-AM characteristics and AM-PM characteristics.

Within certain situations, relatively good knowledge may be known with respect to where a given signal of interest is located, and one or more filters may be implemented in order to improve performance. For example, an anti-aliasing filter may be employed to assist in one or more frequency selective measurements as may be employed within such systems (e.g., such as those including frequency selective power measurement or detection). By appropriately implementing such one or more modules, functional blocks, circuitries, etc., appropriate signal processing may be effectuated so that the dynamic range requirements associated with such measurements including frequency selective measurements may be effectively reduced. For example, when there is at least some knowledge of one or more harmonics, intermodulation products, etc. within a signal of interest, certain signal processing may be performed to ensure that more accurate measurements including frequency selective measurements may be made without necessarily stringent requirements for associated measurement modules, functional blocks, circuitries, etc. and/or equipment. That is to say, by employing appropriate signal processing, relatively lower end and not strictly high-performance measurement modules, functional blocks, circuitries, etc. and/or equipment may be used without deleteriously affecting overall performance.

For example, certain embodiments operate by employing a copy of the signal of interest and processing that copy in accordance with appropriate signal processing for improving associated measurements including frequency selective measurements (e.g., power management or detection). Such appropriate signal processing facilitates improvement in such measurements, and can be used to drive or direct the steepest descent and/or dithering operation which may be employed for calculating one or more tap values (e.g., in accordance with tap convergence processing) by reducing the dynamic range at the input of such measurement modules, functional blocks, circuitries, etc. and/or equipment in accordance with such noise canceling techniques as described herein. Generally speaking, improvement of such measurements including frequency selective measurements (e.g., power management or detection) may be achieved by reducing the dynamic range at the input of such measurement modules, functional blocks, circuitries, etc. and/or equipment.

In addition, it is noted that various embodiments operate in accordance with a steepest descent and/or dithering operation which is used to calculate one or more values (e.g., one or more values as may be calculated by controller that may drive operation of an adapter, one or more filters including frequency tunable filters, a synthesizer, one or more power detectors, etc. as may be understood with respect to other diagrams and/or embodiments herein), and such steepest descent and/or dithering operation may also be employed for selecting or calculating one or more variable gain and/or phase taps within a signal of interest (SOI) (noise) canceller. However, it is noted that more than one respective steepest descent and/or dithering operation will not be performed at the same time in most embodiments. For example, while a steepest descent and/or dithering operation may be performed with respect to selecting or calculating one or more variable gain and/or phase taps within a signal of interest (SOI) (noise) canceller, such steepest descent and/or dithering operations as may be performed by a controller should be at least temporarily stopped. Generally speaking, it may be undesirable to switch multiple variables at a given time, and any steepest descent and/or dithering operations as may be employed by a controller should be decoupled from any steepest descent and/or dithering operation operative for selecting or calculating one or more variable gain and/or phase taps within a signal of interest (SOI) (noise) canceller.

Considering an exemplary embodiment in which the average power of the signal at the input to the up-converter may be 60 dBmV, and the power at the stronger output of the coupler may be 59 dBmV, or 56 dBmV in each of two channels, while the power at the lower output of the coupler may be 40 dBmV total. The spurious emission requirement in some 6 MHz bandwidth may be −70 dBc compared to the power in one channel, or −14 dBmV. The spurious emissions requirement referenced to the coupler output to the power measurement function is −33 dBc. It is noted that the thermal noise floor at room temperature is −57.5 dBmV. A measurement system with an effective 15 dB noise figure places the measurement system noise floor (for a 6 MHz bandwidth measurement) at −42.5 dBmV, which desensitizes the measurement of an at-spec amount of spurious emissions in this example by less than 0.5 dB. This is sufficiently accurate to drive a gradient or steepest descent and/or dithering operation for converging taps (e.g., dithering), since the desensitization is relatively small and still allows monotonicity, which is critical.

It is noted that 15 dB noise figure for the measurement system is a relatively relaxed requirement, even for the frequencies of application, compared to commercial test equipment. As such, it may be noted that relatively lower end modules, functional blocks, circuitries, etc. may be employed within a given embodiment for effectuating such measurements including frequency selective measurements in comparison to that which may be provided by commercial test equipment; alternatively, relatively lower end commercial test equipment may be employed.

It is noted that the presence of the strong signal of interest is typically problematic in such measurements, and filtering to reduce the signal of interest prior to power measurement, and thus the dynamic range of the power measurement equipment, is provided in the typical embodiment. One embodiment uses filtering to attenuate the signal of interest frequencies compared to the spurious emissions frequencies intended for measurement, and the filtering is followed by power detection or measurement (e.g., which may be effectuated using an analog to digital converter (ADC) with sufficient linearity, e.g., with the reduced signal of interest power compared to the spurious emissions specification limit)) to prevent degrading amounts of intermodulation distortion (and/or harmonic distortion) which would unduly desensitize the power measurement in the frequencies where the spurious emissions requirements are applicable.

Another embodiment uses noise canceling techniques to further reduce the energy in the signal of interest frequencies, compared to the spurious emissions specification limit, prior to power measurement in spurious emissions specification frequencies. For example, as described elsewhere herein, if at least some information is known regarding the signal of interest frequencies, appropriate signal processing may be made in accordance with such noise cancellation techniques to reduce the dynamic range at an input of one or more modules, functional blocks, circuitries, etc. and/or test equipment implemented to perform measurements including frequency selective measurements (e.g., power detection or measurement). Of course, care must be taken to avoid significant corruption of the measurement of the targeted spurious emissions when reducing signal of interest energy, or else the steepest descent and/or dithering algorithm will be potentially corrupted by misleading measurements.

Figure 23:
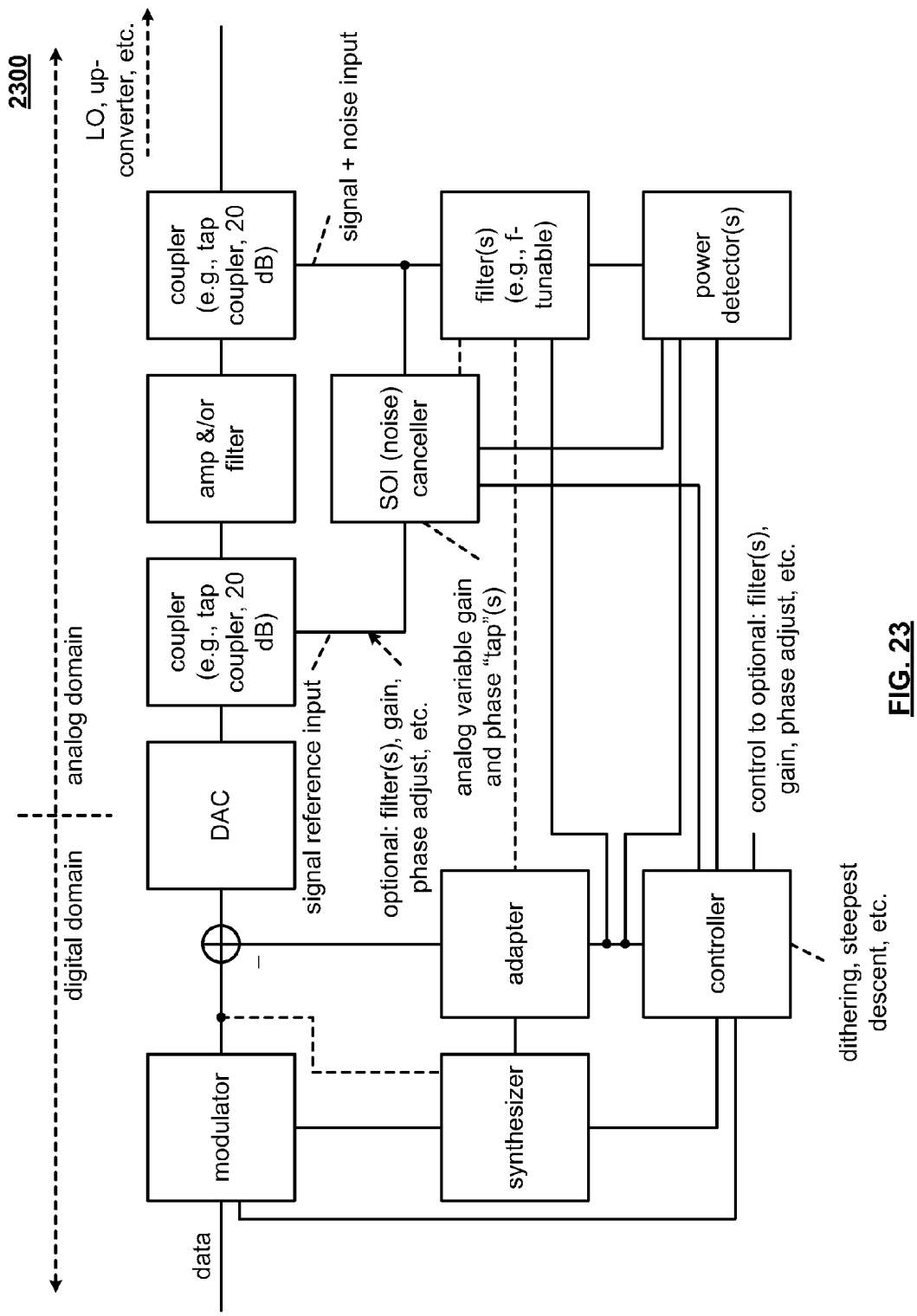
FIG. 23 illustrates an embodiment of distortion synthesis, including adaptation thereof, for improving noise power measurement as may be operative to reduce dynamic range associated with power measurement or detection or other frequency selective measurements employed therein.
Figure 24:
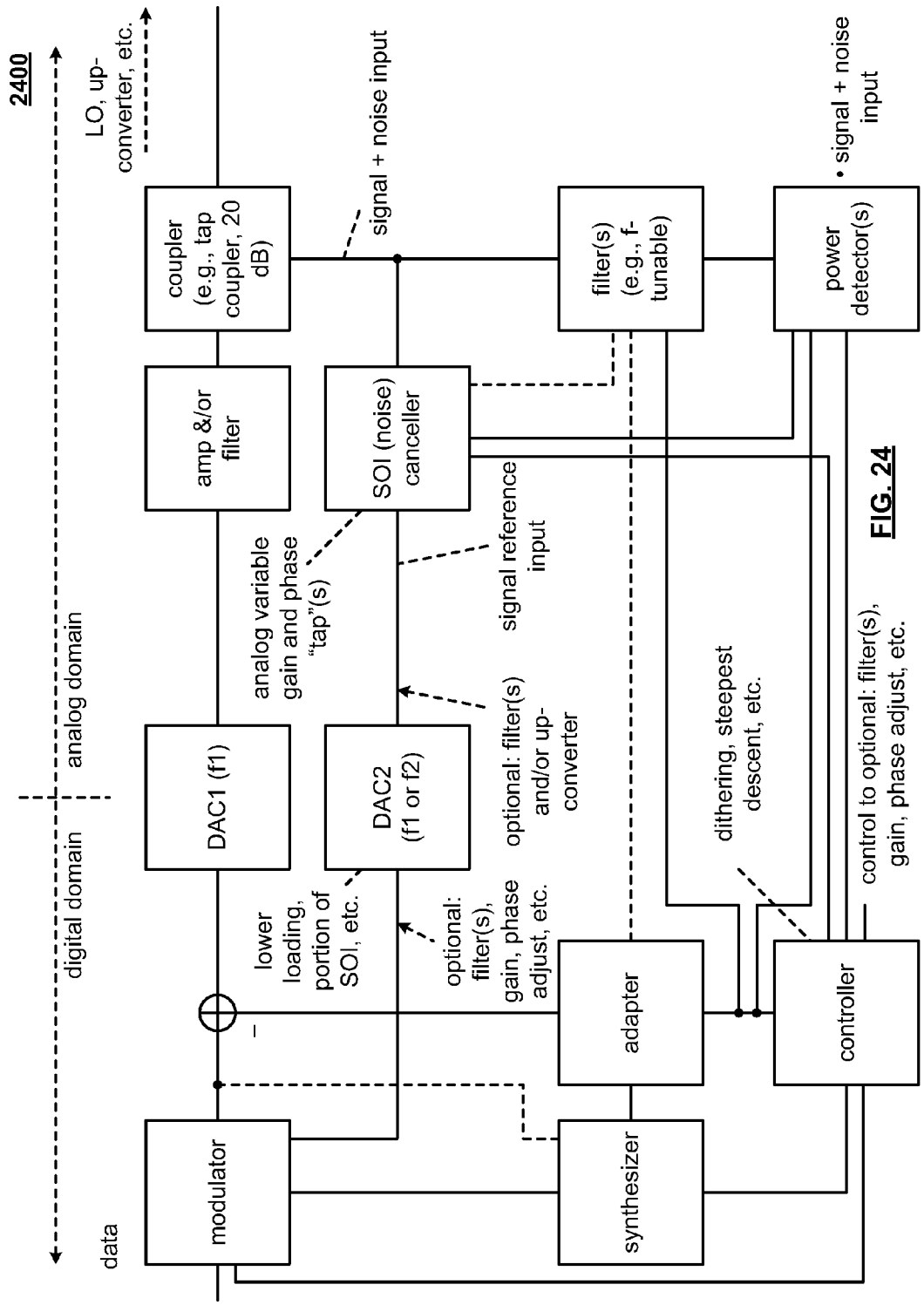
FIG. 24 and FIG. 25 illustrate alternative embodiments of distortion synthesis, including adaptation thereof, for improving noise power measurement as may be operative to reduce dynamic range associated with power measurement or detection or other frequency selective measurements employed therein.

The noise canceling techniques can be operative with analog means, with one or more analog variable gain and/or phase "tap" (e.g., such as in accordance with a signal of interest (SOI) (noise) canceller as pictorially illustrated within FIG. 23, FIG. 24, intricately five). Steepest descent and/or dithering techniques may be employed in accordance with selecting or calculating such one or more variable gain and/or phase taps. It is noted that in one embodiment with noise canceling techniques applied to the signal of interest in the measurement path that substantial filtering to relatively attenuate the signal of interest is not needed.

With respect to such steepest descent and/or dithering operations, such operations may be generally described as measuring performance based on a first coefficient, then taking a step in a given direction and determining whether or not performance improved or degraded. If the performance improved, then a second coefficient (e.g., being the first coefficient modified by the step) is then employed, and the process is repeated. Alternatively, if the performance degraded, then the first coefficient is still employed, and a step is taken in the opposite direction and the process operates by determining whether or not performance improved or degraded. If the performance improved in this second/opposite direction, then a third coefficient (e.g., being the first coefficient modified by the step taken in the second/opposite direction) is then employed, and the process is repeated. When no improvement is achieved when stepping from a given coefficient in either direction, then the latest resultant coefficient is that which is selected or computed in accordance with the steepest descent and/or dithering operation. In accordance with selecting or computing a tap coefficient, such tap coefficient steepest descent and/or dithering processing may be applied (a) for minimizing power measurements for both minimizing the distortion created by the transmitter and also (b) for minimizing the signal of interest energy which desensitizes the distortion power measurement. While a general description of the steepest descent and/or dithering operation is provided herein, further details are included within the U.S. Utility application Ser. No. 10/879,673, entitled "System and Method for adjusting multiple control loops using common criteria," filed on Jun. 29, 2004, now issued as U.S. Pat. No. 7,961,823 B2 on Jun. 14, 2011, which has been incorporated by reference herein as indicated above. For example, in the referenced application/patent, the same error power measurement undergoes minimization and is used for driving both of the respective function's (a) and (b) (described above) taps. The reader is referred to referenced application/patent for additional details regarding gradient or steepest descent and/or dithering operation.

However, as applied with in various embodiments and/or diagrams herein, the same or different respective functions (a) and (b) (described above) may be employed to minimize the same error power measurement and to drive both of the respective function's (a) and (b) (described above) taps' convergence. In addition, in one particular embodiment, the power measurement driving the minimization of the signal of interest energy that desensitizes the noise or distortion power measurement is implemented such that it intentionally captures more of the signal of interest bandwidth than is captured in accordance with the measurement of noise or distortion power which is driving the minimization of the transmitter distortion.

FIG. 23 illustrates an embodiment 2300 of distortion synthesis, including adaptation thereof, for improving noise power measurement as may be operative to reduce dynamic range associated with power measurement or detection or other frequency selective measurements employed therein. As can be seen within this diagram, two different respective couplers are implemented before and after an amplifier and/or filter along the signal path extending from the DAC. The first coupler provides a signal reference input, and the second coupler provides a signal plus noise input to a SOI (noise) canceller. The output from the SOI (noise) canceller may subsequently undergo measurement including frequency selective measurements (e.g., power detection or measurement by one or more power detectors). As also described elsewhere herein, such appropriate signal processing is effectual to improve noise measurements by reducing the dynamic range at an input of one or more modules, functional blocks, circuitries, etc. and/or test equipment implemented to make such measurements. In the instant embodiment 2300, by employing the SOI (noise) canceller, the dynamic range is effectively reduced at the input of the one or more power detectors thereby improving noise power detection or measurement.

Considering one embodiment where an amplifier and/or filter following the DAC is generating most of the harmful distortion products, coupling some of the signal of interest away from this point (e.g., using the first coupler implemented after the DAC and before the amplifier and/or filter) and using this as the signal reference input to the noise canceller (e.g., SOI (noise) canceller), the noise canceller will operate to reduce the signal of interest power substantially into the power measurement function without substantially impacting (desensitizing) the spurious emissions power measurement, owing to the signal reference input to the noise canceller not containing the spurious energy added by the amplifier and/or filter.

Figure 25:
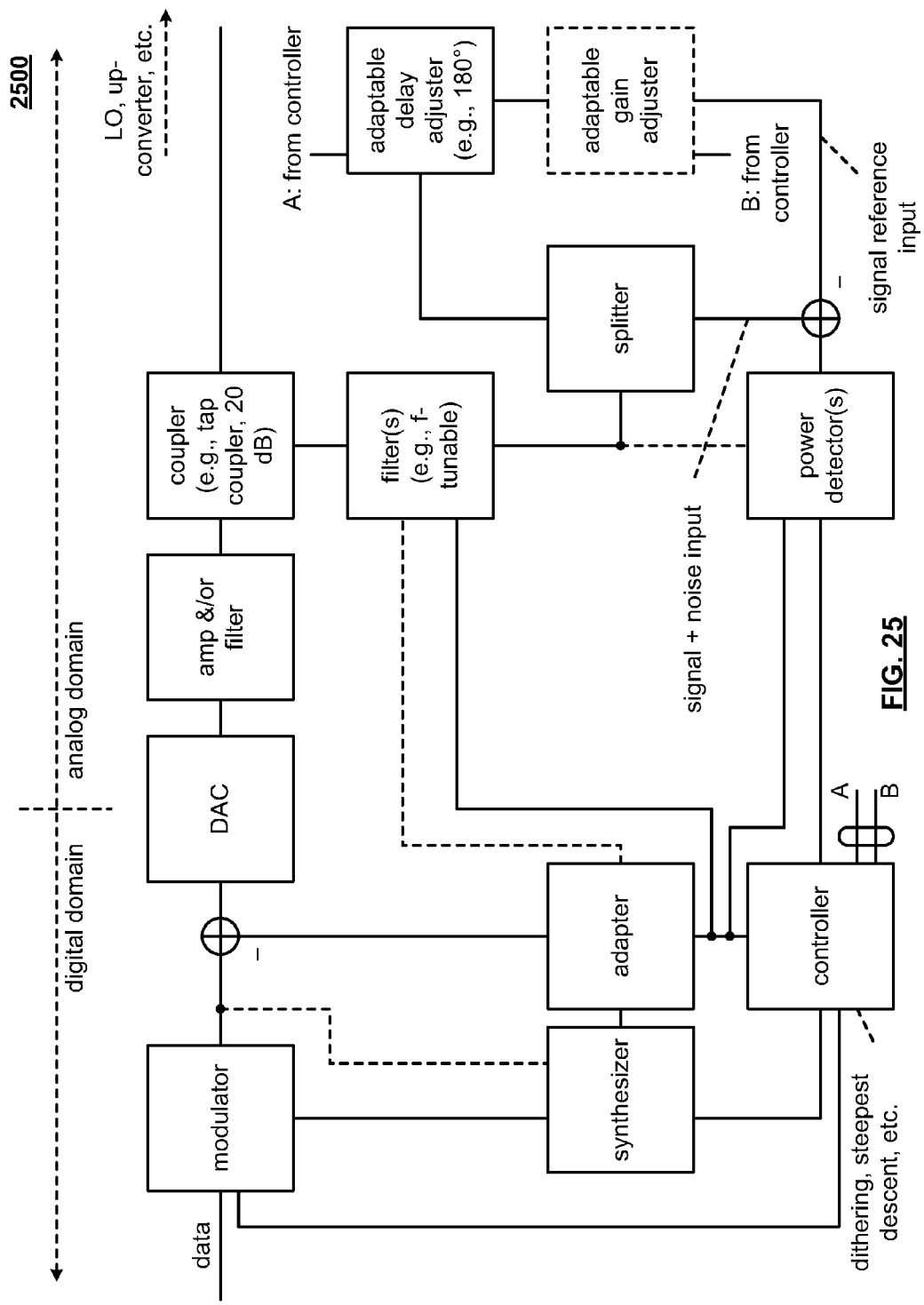

FIG. 24 and FIG. 25 illustrate alternative embodiments 2400 and 2500, respectively, of distortion synthesis, including adaptation thereof, for improving noise power measurement as may be operative to reduce dynamic range associated with power measurement or detection or other frequency selective measurements employed therein.

Referring to an alternative embodiment 2400 of FIG. 24, another or second DAC (which may be operating at the same frequency or a different frequency as the primary/first DAC) is operated at (for example) lower loading than the signal of interest DAC, and is input as the signal reference input of the noise canceller ahead of the power measurement function. By operating this second DAC at a lower loading and overall power level, it is substantially absent the harmful spurious emissions targeted by the synthesizer, and provides a means for the noise canceller to reduce the signal-of-energy level prior to spurious emissions power measurement, without unduly desensitizing the power measurement (or undoing the monotonicity of the power measurement).

As can be seen with respect to this diagram, one or more filters, scaling/gain, phase adjustment modules, functional blocks, circuitries, etc. may be optionally implemented before and/or after the second DAC. The controller may provide control to adjust any operational parameter of these modules, functional blocks, circuitries, etc.

As can be seen when comparing this diagram with the previous diagram, an additional output from the modulator is used to drive the input of the second DAC, and a coupler need not be implemented between the first DAC and the amplifier and/or filter. The output from the second DAC, which may optionally undergo certain processing as described above, is provided as the signal reference input to the SOI (noise) canceller. The signal plus noise input, that is also provided to the SOI (noise) canceller, is provided from the coupler following the amplifier and/or filter. After undergoing appropriate processing, the signal output from the SOI (noise) canceller is provided to the one or more power detectors.

In even other embodiments, the phase of the signal of interest produced for the noise canceller noise reference input is adjusted (e.g., 180° or some other adjustment amount). For example, the respective inputs to any such SOI (noise) canceller implemented with any given embodiment and/or diagram, namely, the signal reference input, may undergo appropriate adjustment. It is also noted that the signal reference input provided to the SOI (noise) canceller may be adjusted 180° only with respect to a certain frequency bandwidth (e.g., a particular portion of the frequency spectrum or at a particular frequency). Generally speaking, negative phase will undergo increasing for a given amount of delay as the frequency increases. Also, generally speaking, different portions of the frequency bandwidth may undergo adjustment by different amounts (e.g., a first portion undergoing adjustment by 180°, a second portion undergoing adjustment by 360°, a third portion undergoing adjustment by some other value, etc.).

In even other embodiments, the signal of interest produced for the noise canceller noise reference input is adjusted so that it is delayed (or advanced, when the input to the primary DAC is typically buffered) relative to the signal of interest path into the primary DAC. By adjusting the relative delay and/or buffering amount between two signal-of interest paths, a linear phase tilt (between the two signal of interest paths) is manifested. Such adjustment of the relative delay and/or buffering amount between the two respective signal of interest paths may generally be applied to any of a number of different diagrams and/or embodiments presented herein. For example, with respect to FIG. 24, if a delay and/or buffering is introduced in one of the paths, such as between the modulator and the signal reference input that is provided to the SOI (noise) canceller, then appropriate delay and/or buffering may be needed within the other of the paths, such as between the modulator and the signal plus noise input that is provided to the SOI (noise) canceller. Analogously, with respect to FIG. 25, which is described in additional detail below, the use of an adaptable delay adjuster, which may be under the control of the controller therein, may be implemented to appropriate delay, alignment, synchronization, etc. between different respective paths within a given embodiment.

For measuring spurious power close to a 6 MHz signal of interest, manifesting a phase tilt due to relative delay differences corresponding to, for example, 180 degrees across a 6 MHz span, a one-tap noise canceller can reduce signal of interest energy more than it will reduce the spurious energy adjacent to the signal of interest band. In even other embodiments, leveraging relative delay of the two inputs to the noise canceller bandpass filters are employed to help isolate the signal of interest and its adjacent spurious emissions band targeted for measurement from signal of interest energy at more distant portions of the spectrum. For example, the one or more filters, which may be frequency selective or frequency tunable folders, may be implemented as one or more bandpass filters. For example, with respect to the embodiment 2300 and FIG. 23 in the embodiment 2400 and FIG. 24, the two respective inputs to the SOI (noise) canceller, namely the signal reference input and the signal plus noise input, may undergo respective bandpass filtering. With respect to the embodiment 2500 of FIG. 25, given the particular architecture and art apology thereof, the one or more frequency tunable filters may be implemented as one or more bandpass filters such that the implemented one or more frequency tunable filters therein will modify both of the respective paths with a common, singular filter (e.g., both of the respective signal reference input and the signal plus noise input passed through the common, singular filter)

Referring to an alternative embodiment 2500 of FIG. 25, the analog tap in the noise canceller manifests phase adjustments via a controllable or adaptable delay adjuster, which may be implemented as a voltage controlled adjustable delay line. In one embodiment, with such an adjustable delay tap, the coupled-off signal of interest (e.g., which may be replete with spurious energy adjacent to a portion of the signal of interest spectrum), may be split (e.g., effectuated by a splitter) such that one of the paths passes through the controllable or adaptable delay adjuster (e.g., an adjustable delay tap), and the delay is adjusted (along with a gain tap in one embodiment) to minimize the power in the combination (e.g., effectually operated as a noise canceller). Since the two inputs to the noise canceller have similar phase across their respective frequency spectra, and since they are relatively undelayed, the controllable or adaptable delay adjuster (e.g., an adjustable delay tap) will be operated to phase match (via its respective delay) the signal of interest to achieve the most canceling possible, and with a suitable starting delay difference in the adjustable delay device, the signal of interest will be reduced in the noise canceller relative to the adjacent spurious emissions. In these embodiments operating on the principle of phase tilt associated with delay beating against a similar signal with flat phase, since the signal of interest energy is so much stronger than the spurious emissions limit, the reduction of the signal of interest energy will dominate the converged solution. It is noted that while accuracy in the power measurements is not critical (e.g., and as such, relatively lower end, less high-performing modules, functional blocks, circuitries, etc. may be employed to effectuate such measurements), monotonicity to drive the gradient or dithering convergence is critical (e.g., based upon the operation of the steepest descent and/or dithering operation), differentiating the requirements of this specialized power measurement function from commercial test equipment (e.g., commercially available spectrum analyzers, off-the-shelf test equipment and/or other equipment that may be included within various housings, structures, laboratories, etc.).

Certain diagrams are presented and described below with respect to method steps. While certain of the respective method steps diagrams relate to certain architectures, designs, layouts, etc. of various modules, functional blocks, circuitries, etc. as may be implemented in accordance with several of the previous diagrams and/or embodiments, the reader will properly understand that analogous method steps may be associated with an derived from any of the various architectures, designs, layouts, etc. of various modules, functional blocks, circuitries, etc. as may be implemented in accordance with several of the previous diagrams and/or embodiments. That is to say, any of the architectures, designs, layouts, etc. of various modules, functional blocks, circuitries, etc. as may be implemented in accordance with several of the previous diagrams and/or embodiments may alternatively be understood in accordance with corresponding and respective method steps.

FIG. 26A, FIG. 26B, FIG. 27, FIG. 28A, and FIG. 28B are diagrams illustrating embodiments of methods 2600, 2601, 2700, 2800, and 2801, respectively, for operating one or more devices including at least one digital to analog converter (DAC) therein.

Figure 26:
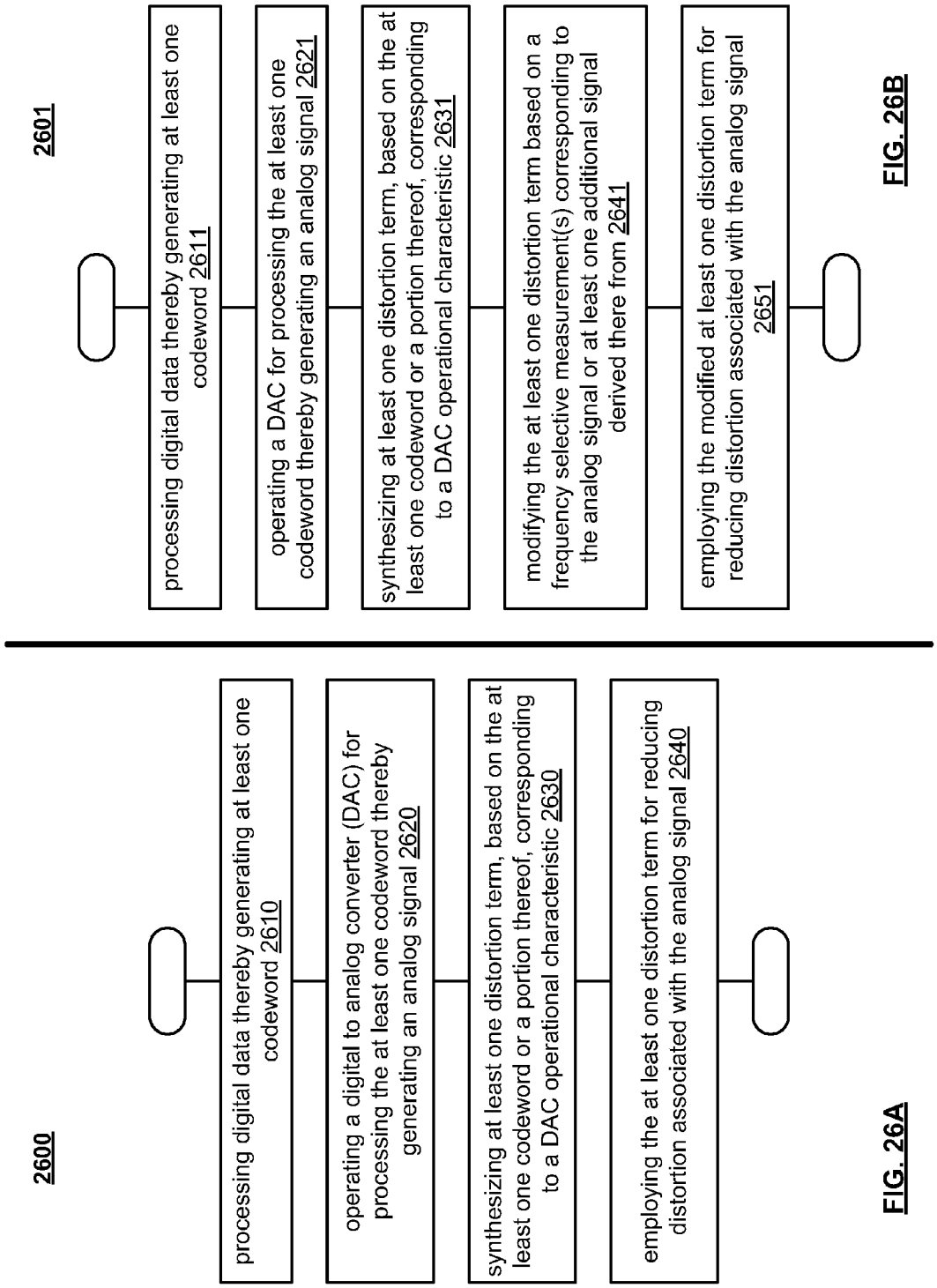

Referring to method 2600 of FIG. 26A, the method 2600 begins by processing digital data thereby generating at least one codeword, as shown in the block 2610. In certain embodiments, the operations of the block 2610 may be viewed as that which may be performed by a modulator. The method 2600 then continues by operating a digital to analog converter (DAC) for processing the at least one codeword thereby generating an analog signal, as shown in a block 2620.

The method 2600 then operates by synthesizing at least one distortion term, based on the at least one codeword or a portion thereof, corresponding to a DAC operational characteristic, as shown in a block 2630. For example, such a distortion term may be related to one or more operational characteristics of the DAC. Multiple different and respective embodiments and/or diagrams are presented herein describing particular characteristics associated with various DAC operational characteristics. In some instances, the distortion synthesis is particularly targeted in dealing with relatively low frequency spurious admissions the may be generated in accordance with him perfective digital to analog conversion. Alternatively, and other embodiments, such distortion synthesis may be particularly targeted in dealing with improving transition band and/or stop the performance. In even other embodiments, such distortion synthesis may be particularly targeted in dealing with improving skirt and/or spectral mask performance. In yet other embodiments, such distortion synthesis may be particularly targeted in improving various measurements including frequency selective measurements (e.g., such as noise power or detection measurements) in accordance with reducing the dynamic range associated with an input of such modules, functional blocks, circuitries, etc. and/or test equipment as may be implemented to effectuate such measurements. Generally speaking, in accordance with such synthesis of one or more distortion terms in accordance with the various diagrams and/or embodiments herein, such one or more distortion terms may be particularly targeted in dealing with any one or more of the various operational modes as described herein. That is to say, more than one given application may be targeted in accordance with calculating any one or more distortion terms.

The method 2600 then continues by employing the at least one distortion term for reducing distortion associated with the analog signal, as shown in a block 2640. In certain, the operations of the blocks 2630 and 2640 may be performed alternatively before the operation of a block 2620. That is to say, in certain situations, after the at least one distortion term has been synthesized and after the one or more distortion terms have been used for reducing distortion, such as in accordance with combining the at least one distortion term with the at least one codeword, then the modified at least one codeword is provided to the DAC thereby generating the analog signal. In addition, in certain embodiments, it is noted that the operation of the respective blocks are performed substantially or approximately contemporaneously.

Referring to method 2601 of FIG. 26A, as can be seen, this diagram has some similarities to the previous diagram. The method 2601 begins by processing digital data thereby generating at least one codeword, as shown in a block 2611. The method 2601 then continues by operating a DAC for processing the at least one codeword thereby generating an analog signal, as shown in a block 2621.

Then, the method 2601 operates by synthesizing at least one distortion term, based on the at least one codeword or portion thereof, corresponding to a DAC characteristic, as shown in a block 2631. The method 2601 continues by modifying the at least one distortion term based on a frequency selective measurement corresponding to the analog signal or least one additional signal derived therefrom, as shown in a block 2641. For example, in some instances, the frequency selective measurement is that of a frequency selective power measurement that is made in the analog domain based on the analog signal or at least one additional signal derived therefrom. For example, the at least one additional signal derived therefrom may be a modified version of the analog signal that may have undergone filtering including that by a frequency tunable filter.

The method 2601 then continues by employing the modified at least one distortion term for reducing distortion associated with the analog signal, as shown in a block 2651. As can be seen when comparing this diagram to the previous diagram, the at least one distortion term may undergo modification based upon one or more frequency selective measurements corresponding to the analog signal or at least one additional signal derived therefrom. As such, the method 2601 may outperform the method 2600 and certain situations given that additional information is provided and used for generating the final/resultant distortion term that is employed for reducing distortion associated with the analog signal.

Figure 27:
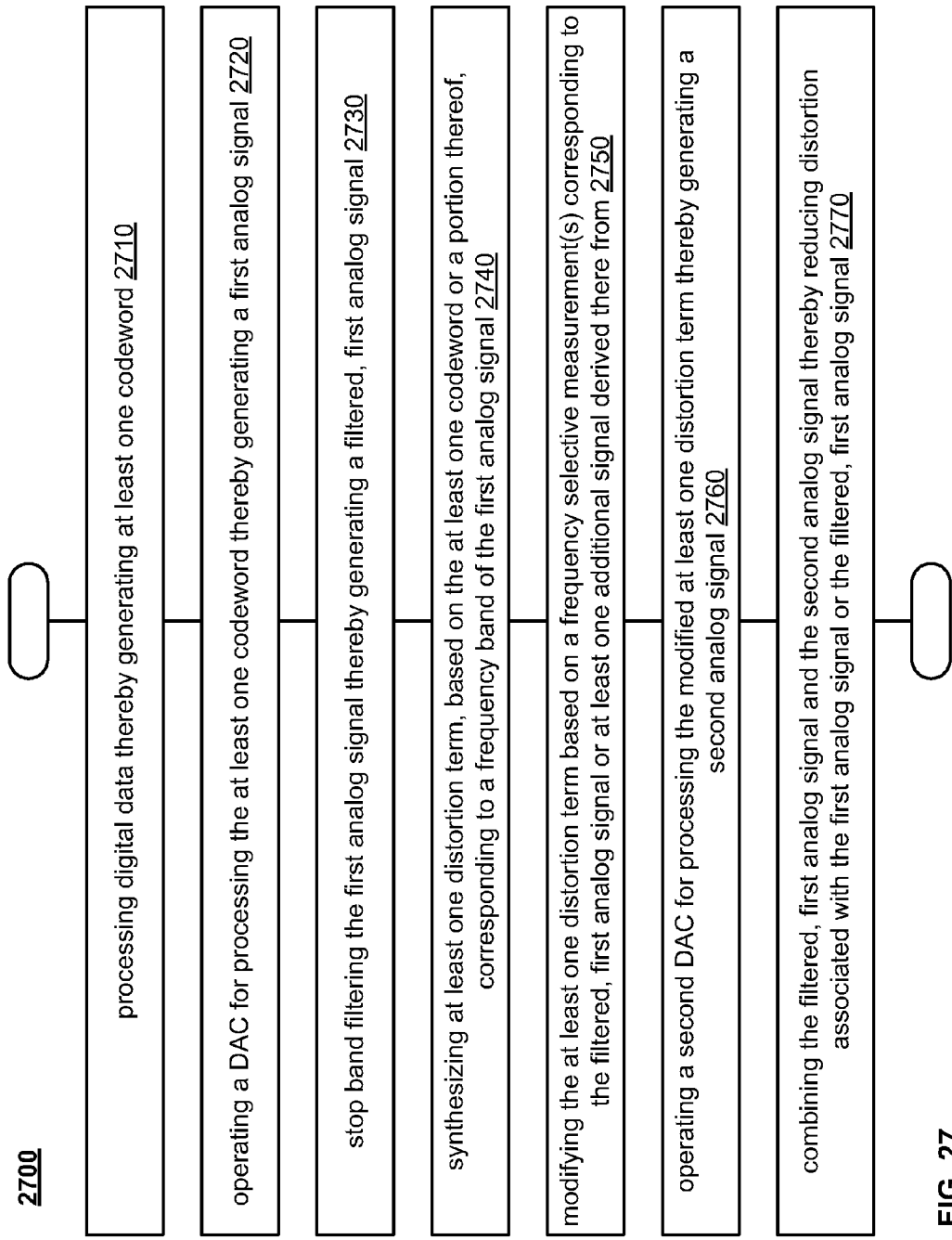

Referring to method 2700 of FIG. 27, the method 2700 begins by processing digital data thereby generating least one codeword, as shown in a block 2710. The method 2700 then continues by operating a DAC for processing the at least one codeword thereby generating a first analog signal, as shown in a block 2720.

Then, the method 2700 operates by stop band filtering the first analog signal thereby generating a filtered, first analog signal, as shown in a block 2730. Based on the at least one codeword or a portion thereof, the method 2700 operates by synthesizing at least one distortion term corresponding to a frequency band of the first analog signal, as shown in a block 2740. After this at least one distortion term has been synthesized, the method 2700 operates by modifying the at least one distortion term based on one or more frequency selective measurements corresponding to the filtered, first analog signal or at least one additional signal derived therefrom, as shown in a block 2750.

The method 2700 continues by operating a second DAC for processing the modified at least one distortion term thereby generating a second analog signal, as shown in a block 2760. The method 2700 then operates by combining the filtered, first analog signal and the second analog signal thereby reducing distortion associated with the first analog signal or the filtered, first analog signal, as shown in a block 2770.

Figure 28A:
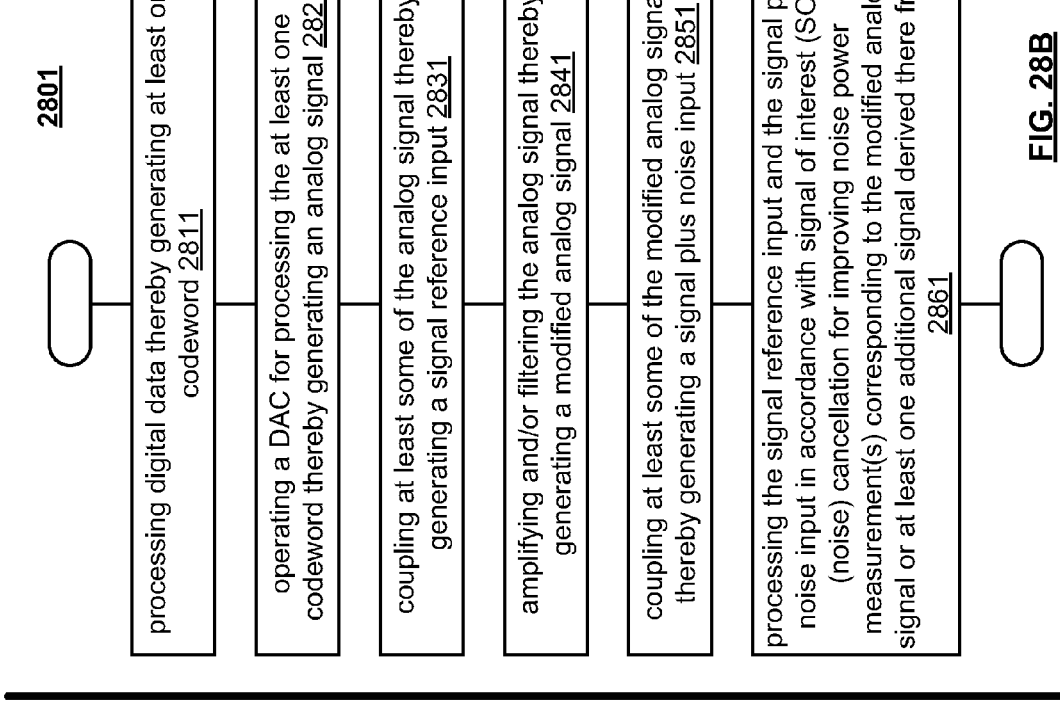
Figure 28B:
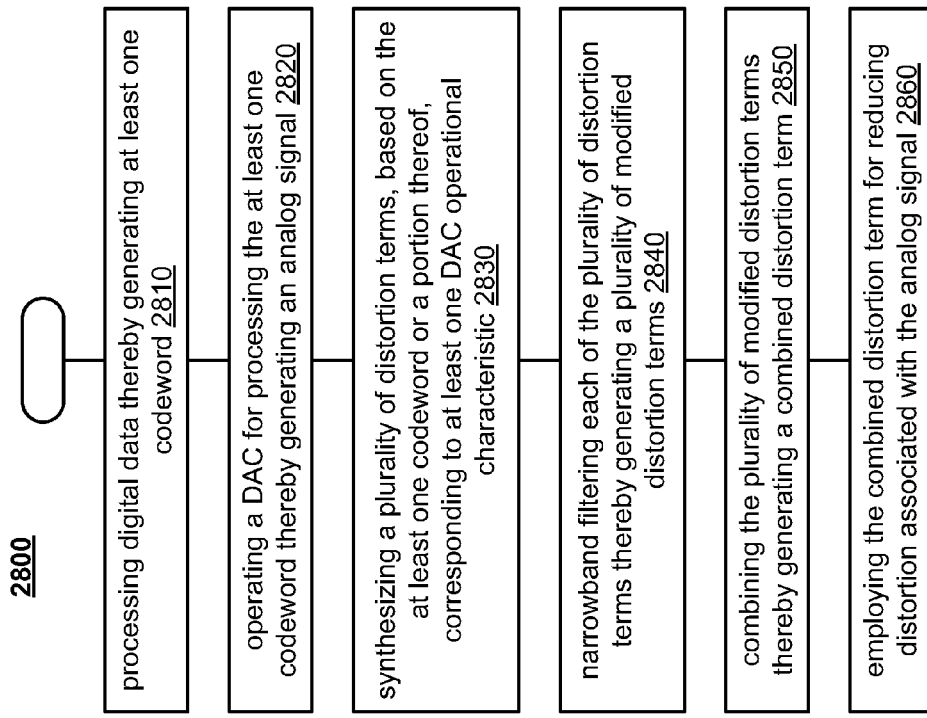

Referring to method 2800 of FIG. 28A, the method 2800 begins by processing digital data thereby generating at least one codeword, as shown in a block 2810. The method 2800 then continues by operating a DAC for processing the at least one codeword thereby generating an analog signal, as shown in a block 2820. The method 2800 then operates by synthesizing a plurality of distortion terms, based on the at least one codeword or portion thereof, corresponding to at least one DAC operational characteristic, as shown in a block 2830.

The method 2800 then continues by narrowband filtering each of the plurality of distortion terms thereby generating a plurality of modified distortion terms, as shown in a block 2840. In certain situations, each respective narrowband filtering operation is applied to each respective one of the plurality of distortion terms, such that a first narrowband filtering associated with a first portion of the frequency spectrum is applied to a first of the plurality of distortion terms, a second narrowband filtering associated with a second portion of the frequency spectrum is applied to a second of the plurality of distortion terms, and so on.

The method 2800 operates by combining the plurality of modified distortion terms thereby generating a combined distortion term, as shown in a block 2850. The method 2800 continues by employing the combined distortion term for reducing distortion associated with the analog signal, as shown in a block 2860.

Referring to method 2801 of FIG. 28A, the method 2801 begins by processing digital data thereby generating at least one codeword, as shown in a block 2811. The method 2801 continues by operating a DAC for processing the at least one codeword thereby generating an analog signal, as shown in a block 2821.

The method 2801 operates by coupling at least some of the analog signal thereby generating a signal reference input, as shown in a block 2831. The coupling of at least some of the analog signal may be effectuated by a coupler implemented after a DAC and before a subsequent amplifier and/or filter. The signal reference input may be one of at least two inputs provided to a SOI (noise) canceller as may be understood with respect to certain diagrams and/or embodiments herein.

The method 2801 continues by amplifying and/or filtering the analog signal thereby generating a modified analog signal, as shown in a block 2841. Subsequently, the method 2801 operates by coupling at least some of the modified analog signal thereby generating a signal plus noise input, as shown in a block 2851. The coupling of at least some of the modified analog signal they be effectuated by a coupler are implemented after and amplifier and/or filter. The signal plus noise input may be another one of at least two inputs provided to a SOI (noise) canceller as may be understood with respect to certain diagrams and/or embodiments herein.

The method 2801 operates by processing the signal reference input and the signal plus noise input in accordance with SOI (noise) cancellation for improving one or more noise power measurements corresponding to the modified analog signal or at least one additional signal derived therefrom, as shown in a block 2861.

Again, it is noted that while certain diagrams and/or embodiments of method steps have been included herein, it is noted that any of the various architectures, designs, layouts, etc. of various modules, functional blocks, circuitries, etc. as may be implemented in accordance with any of the several of the previous diagrams and/or embodiments may properly understand in accordance with analogous method steps as may be associated with an derived from any of the various architectures, designs, layouts, etc. of various modules, functional blocks, circuitries, etc. as may be implemented in accordance with several of the previous diagrams and/or embodiments. Again, any of the architectures, designs, layouts, etc. of various modules, functional blocks, circuitries, etc. as may be implemented in accordance with several of the previous diagrams and/or embodiments may alternatively be understood in accordance with corresponding and respective method steps.

With respect to the various diagrams and embodiments included herein, it is noted that, while certain generic terminology such as modulator, DAC, synthesizer, adapter, coupler, filter, power detector, controller, etc. are used among multiple diagrams, it is noted that each respective diagram and embodiment may include such components having different characteristics, operational parameters, etc. For example, the modulator of one diagram and/or embodiment may not necessarily be identical to a modulator within another diagram and/or embodiment. That is to say, while the operation of modulation as performed by a modulator may be generically similar within the two respective devices, any such to modulators may operate in accordance with different characteristics, operational parameters, etc.

As at least one example, a first implementation of a modulator may operate in accordance with processing data having a first data characteristics (e.g., having a certain bit rate, a certain symbol rate, etc.) and generating codewords having first codeword characteristics (e.g., X number of bits per codeword, spanning a particular dynamic range between a largest codeword and a smallest codeword or a largest negative codeword, having a particular step between the respective codewords, etc.). Analogously, a second implementation of a modulator may operate in accordance with processing data having second data characteristics that are different from those employed by the first modulator. Similarly, the different other respective components illustrated within the different respective guide diagrams and/or embodiments may also operate in accordance with different characteristics, operational parameters, etc. As may be understood, a DAC of one diagram and/or embodiment may operate in accordance with a first sampling frequency, a first output power, a first dynamic range, etc., while another DAC of another diagram and/or embodiment may operate in accordance with a second sampling frequency, a second output power, a second dynamic range, etc. Generally speaking, while the generic functions and operations of components having a similar nomenclature are similar, the specific characteristics, operational parameters, etc. by which each is specifically implemented and operated may differ from embodiment to embodiment.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "module", "processing circuit", and/or "processing unit" (e.g., including various modules and/or circuitries such as may be operative, implemented, and/or for encoding, for decoding, for baseband processing, for modulating, for synthesizing, for filtering, for digital to analog conversion, etc.)

may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may have an associated memory and/or an integrated memory element, which may be a single memory device, a plurality of memory devices, and/or embedded circuitry of the processing module, module, processing circuit, and/or processing unit. Such a memory device may be a read-only memory (ROM), random access memory (RAM), volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a functional block that is implemented via hardware to perform one or module functions such as the processing of one or more input signals to produce one or more output signals. The hardware that implements the module may itself operate in conjunction software, and/or firmware. As used herein, a module may contain one or more sub-modules that themselves are modules.

While particular combinations of various functions and features of the present invention have been expressly described herein, other combinations of these features and functions are likewise possible. The present invention is not limited by the particular examples disclosed herein and expressly incorporates these other combinations.

What is claimed is:
1. An apparatus, comprising:
a modulator for processing digital data thereby generating at least one codeword;
a digital to analog converter (DAC) for processing the at least one modified codeword thereby generating an analog signal;
a synthesizer for providing a plurality of distortion terms, each respective distortion term based on the at least one codeword or at least one portion thereof, corresponding to at least one DAC operational characteristic;
a plurality of narrowband filters for receiving the plurality of distortion terms, such that each of the plurality of narrowband filters for receiving a respective one of the plurality of distortion terms, thereby generating a plurality of narrowband filtered distortion terms;
a plurality of adapters for modifying at least one of the plurality of distortion terms, such that each of the plurality of adapters for receiving a respective one of the plurality of narrowband filtered distortion terms, thereby generating a plurality of adapted distortion terms;
a combiner for combining the plurality of adapted distortion terms or a subset thereof thereby generating a combined signal;
a coupler for outputting at least a portion of analog signal;

a frequency selective filter for selecting a spectral band component of the at least a portion of analog signal;

a power detector for measuring power of the spectral band component; and a controller for directing operation of at least one of the plurality of narrowband filters, the plurality of adapters, the synthesizer, and the modulator based on the measured power of the spectral band component; and wherein:

at least one of the plurality of distortion terms operative for reducing distortion associated with the analog signal.

2. The apparatus of claim 1, wherein:

the DAC for processing a combination of the at least one modified codeword and the combined signal thereby generating the analog signal.

3. The apparatus of claim 1, further comprising:

at least one additional DAC for processing the combined signal thereby generating at least one additional analog signal; and at least one additional combiner for combining the analog signal and the at least one additional analog signal.

4. The apparatus of claim 1, wherein:

the apparatus being a communication device operative within at least one of a satellite communication system, a wireless communication system, a wired communication system, and a fiber-optic communication system.

5. An apparatus, comprising:

a modulator for processing digital data thereby generating at least one codeword;

a digital to analog converter (DAC) for processing the at least one modified codeword thereby generating an analog signal;

a synthesizer for providing a plurality of distortion terms, each respective distortion term based on the at least one codeword or at least one portion thereof, corresponding to at least one DAC operational characteristic;

a plurality of narrowband filters for receiving the plurality of distortion terms, such that each of the plurality of narrowband filters for receiving a respective one of the plurality of distortion terms, thereby generating a plurality of narrowband filtered distortion terms;

a combiner for combining the plurality of narrowband filtered distortion terms or a subset thereof thereby generating a combined signal; and wherein:

at least one of the plurality of distortion terms operative for reducing distortion associated with the analog signal.

6. The apparatus of claim 5, wherein:

the DAC for processing a combination of the at least one modified codeword and the combined signal thereby generating the analog signal.

7. The apparatus of claim 5, further comprising:

at least one additional DAC for processing the combined signal thereby generating at least one additional analog signal; and at least one additional combiner for combining the analog signal and the at least one additional analog signal.

8. The apparatus of claim 5, wherein:

the DAC being a first DAC;

the analog signal being a first analog signal;

the combined signal being a first combined signal;

the combiner being a first combiner; and the first combiner for combining a first subset of the plurality of narrowband filtered distortion terms thereby generating the first combined signal; and further comprising:

a second combiner for combining a second subset of the plurality of narrowband filtered distortion terms thereby generating the second combined signal;

a second DAC for processing the first combined signal thereby generating a second analog signal;

a third DAC for processing the second combined signal thereby generating a third analog signal;

a third combiner for combining the first analog signal, the second analog signal, and the third analog signal thereby generating a fourth analog signal.

9. The apparatus of claim 8, wherein:

the second DAC corresponding to signal components below a frequency; and the third DAC corresponding to signal components above the frequency.

10. The apparatus of claim 5, further comprising:

a plurality of adapters for modifying at least one of the plurality of distortion terms based on at least one frequency selective measurement corresponding to the analog signal or at least one additional signal derived there from; and wherein:

each of the plurality of plurality of adapters for modifying a respective one of the plurality of distortion terms; and each of the plurality of plurality of adapters respectively implemented between a respective one of the plurality of narrowband filters and the combiner.

11. The apparatus of claim 10, further comprising:

a coupler for outputting at least a portion of analog signal;

a frequency selective filter for selecting a spectral band component of the at least a portion of analog signal;

a power detector for measuring power of the spectral band component; and a controller for directing operation of at least one of the plurality of adapters based on the measured power of the spectral band component.

12. The apparatus of claim 10, wherein:

at least one of the plurality of adapters for performing adaptation of at least one of filtering, gain, phase, and delay adjustment of at least one of the plurality of distortion terms.

13. The apparatus of claim 5, further comprising:

a coupler for outputting at least a portion of analog signal;

a frequency selective filter for selecting a spectral band component of the at least a portion of analog signal;

a power detector for measuring power of the spectral band component; and a controller for directing operation of at least one of the plurality of narrowband filters based on the measured power of the spectral band component.

14. The apparatus of claim 5, wherein:

at least one of the plurality of distortion terms being predetermined.

15. The apparatus of claim 5, wherein:

the synthesizer for generating at least one of the plurality of distortion terms in real time based on a measurement corresponding to the at least one DAC operational characteristic.

16. The apparatus of claim 5, wherein:

the apparatus being a communication device operative within at least one of a satellite communication system, a wireless communication system, a wired communication system, and a fiber-optic communication system.

17. A method, comprising:

processing digital data thereby generating at least one codeword;

operating a digital to analog converter (DAC) for processing the at least one modified codeword thereby generating an analog signal;

synthesizing a plurality of distortion terms, each respective distortion term based on the at least one codeword or at least one portion thereof, corresponding to at least one DAC operational characteristic;

narrowband filtering the plurality of distortion terms, such that each one of the plurality of distortion terms undergoing a respective narrowband filtering, thereby generating a plurality of narrowband filtered distortion terms;

combining the plurality of narrowband filtered distortion terms or a subset thereof thereby generating a combined signal; and employing at least one of the plurality of distortion terms operative for reducing distortion associated with the analog signal.

18. The method of claim 17, further comprising:
operating the DAC for processing a combination of the at least one modified codeword and the combined signal thereby generating the analog signal.

19. The method of claim 17, further comprising:
operating at least one additional DAC for processing the combined signal thereby generating at least one additional analog signal; and
operating at least one additional combiner for combining the analog signal and the at least one additional analog signal.

20. The method of claim 17, further comprising:
modifying the plurality of distortion terms based on at least one frequency selective measurement corresponding to the analog signal or at least one additional signal derived there from.

21. The method of claim 17, further comprising:
coupling at least a portion of analog signal;
frequency selective filtering for selecting a spectral band component of the at least a portion of analog signal;
measuring power of the spectral band component; and
directing operation of at least one of the plurality of adapters based on the measured power of the spectral band component.

22. The method of claim 17, further comprising:
performing adaptation of at least one of filtering, gain, phase, and delay adjustment of at least one of the plurality of distortion terms.

23. The method of claim 17, wherein:
at least one of the plurality of distortion terms being predetermined.

24. The method of claim 17, wherein:
the method performed within a communication device operative within at least one of a satellite communication system, a wireless communication system, a wired communication system, and a fiber-optic communication system.

* * * * *

UNITED STATES PATENT AND TRADEMARK OFFICE
CERTIFICATE OF CORRECTION

PATENT NO. : 8,406,340 B2  Page 1 of 1
APPLICATION NO. : 13/223156
DATED : March 26, 2013
INVENTOR(S) : Thomas J. Kolze et al.

It is certified that error appears in the above-identified patent and that said Letters Patent is hereby corrected as shown below:

In the Claims

Col. 40, line 23, in claim 10: after "plurality of" delete "plurality of"

Signed and Sealed this
Seventh Day of January, 2014

Margaret A. Focarino
*Commissioner for Patents of the United States Patent and Trademark Office*